(12) United States Patent
Jinta et al.

(10) Patent No.: US 11,640,191 B2
(45) Date of Patent: May 2, 2023

(54) DISPLAY DEVICE AND ELECTRONIC APPARATUS

(71) Applicant: SONY SEMICONDUCTOR SOLUTIONS CORPORATION, Kanagawa (JP)

(72) Inventors: Seiichiro Jinta, Kanagawa (JP); Masafumi Miyazaki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 345 days.

(21) Appl. No.: 16/967,861

(22) PCT Filed: Jan. 23, 2019

(86) PCT No.: PCT/JP2019/002033
§ 371 (c)(1),
(2) Date: Aug. 6, 2020

(87) PCT Pub. No.: WO2019/159618
PCT Pub. Date: Aug. 22, 2019

(65) Prior Publication Data
US 2021/0048860 A1 Feb. 18, 2021

(30) Foreign Application Priority Data
Feb. 14, 2018 (JP) .............................. JP2018-023696

(51) Int. Cl.
*G06F 1/20* (2006.01)
*G02F 1/1333* (2006.01)
(Continued)

(52) U.S. Cl.
CPC ........ *G06F 1/206* (2013.01); *G02F 1/133385* (2013.01); *G09G 3/3648* (2013.01); *G09G 2320/041* (2013.01); *H01L 29/786* (2013.01)

(58) Field of Classification Search
CPC .............. G06F 1/206; G02F 1/133385; G09G 3/3648; G09G 2320/041; H01L 29/786
See application file for complete search history.

(56) References Cited

U.S. PATENT DOCUMENTS 8,247,802 B2 * 8/2012 Nomura ................ H01L 27/285
257/E51.027
11,513,409 B2 * 11/2022 Toyotaka ............ H01L 27/1225
(Continued)

FOREIGN PATENT DOCUMENTS

CN 1497660 A 5/2004
CN 1497675 A 5/2004
(Continued)

OTHER PUBLICATIONS

International Search Report and Written Opinion prepared by the Japanese Patent Office dated Mar. 22, 2019, for International Application No. PCT/JP2019/002033.

*Primary Examiner* — Doon Y Chow
(74) *Attorney, Agent, or Firm* — Sheridan Ross P.C.

(57) ABSTRACT

In a display device including: a pixel array unit made up of pixels disposed on a substrate; a peripheral circuit unit that is disposed in a periphery of the pixel array unit and drives the pixels; and a temperature sensor circuit disposed on the same substrate as the pixels, the temperature sensor circuit is configured using an inverter circuit including a plurality of inverters made up of thin film transistors. Then, crystallinity of a channel portion of the thin film transistor of the temperature sensor circuit is different from crystallinity of a channel portion of a thin film transistor constituting the peripheral circuit unit.

20 Claims, 30 Drawing Sheets

(51) Int. Cl.
*G09G 3/36* (2006.01)
*H01L 29/786* (2006.01)

(56) References Cited

U.S. PATENT DOCUMENTS

| | | | |
|---|---|---|---|
| 2004/0200962 A1* | 10/2004 | Ishikawa | G01J 5/08 |
| | | | 257/E27.008 |
| 2007/0075940 A1 | 4/2007 | Nakamura | |
| 2009/0032907 A1* | 2/2009 | Uemura | C30B 29/403 |
| | | | 438/483 |
| 2011/0141157 A1 | 6/2011 | Hiroshima | |
| 2016/0149574 A1 | 5/2016 | Cui et al. | |

FOREIGN PATENT DOCUMENTS

| | | |
|---|---|---|
| CN | 1747172 A | 3/2006 |
| CN | 101123260 A | 2/2008 |
| JP | H08-029265 | 2/1996 |
| JP | 2000-009547 | 1/2000 |
| JP | 2007-101951 | 4/2007 |
| JP | 2010-283233 | 12/2010 |
| JP | 2011-128193 | 6/2011 |

\* cited by examiner

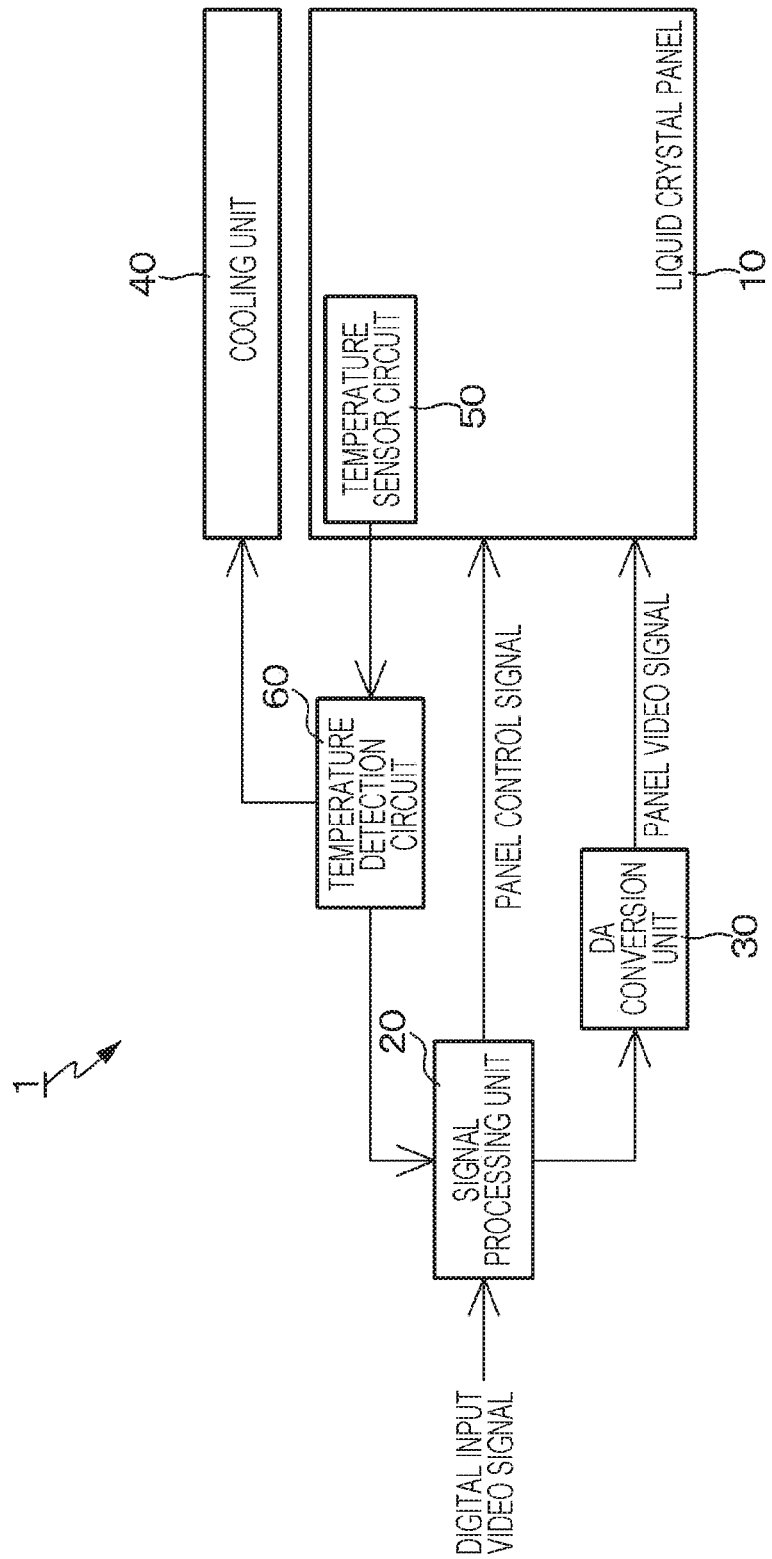

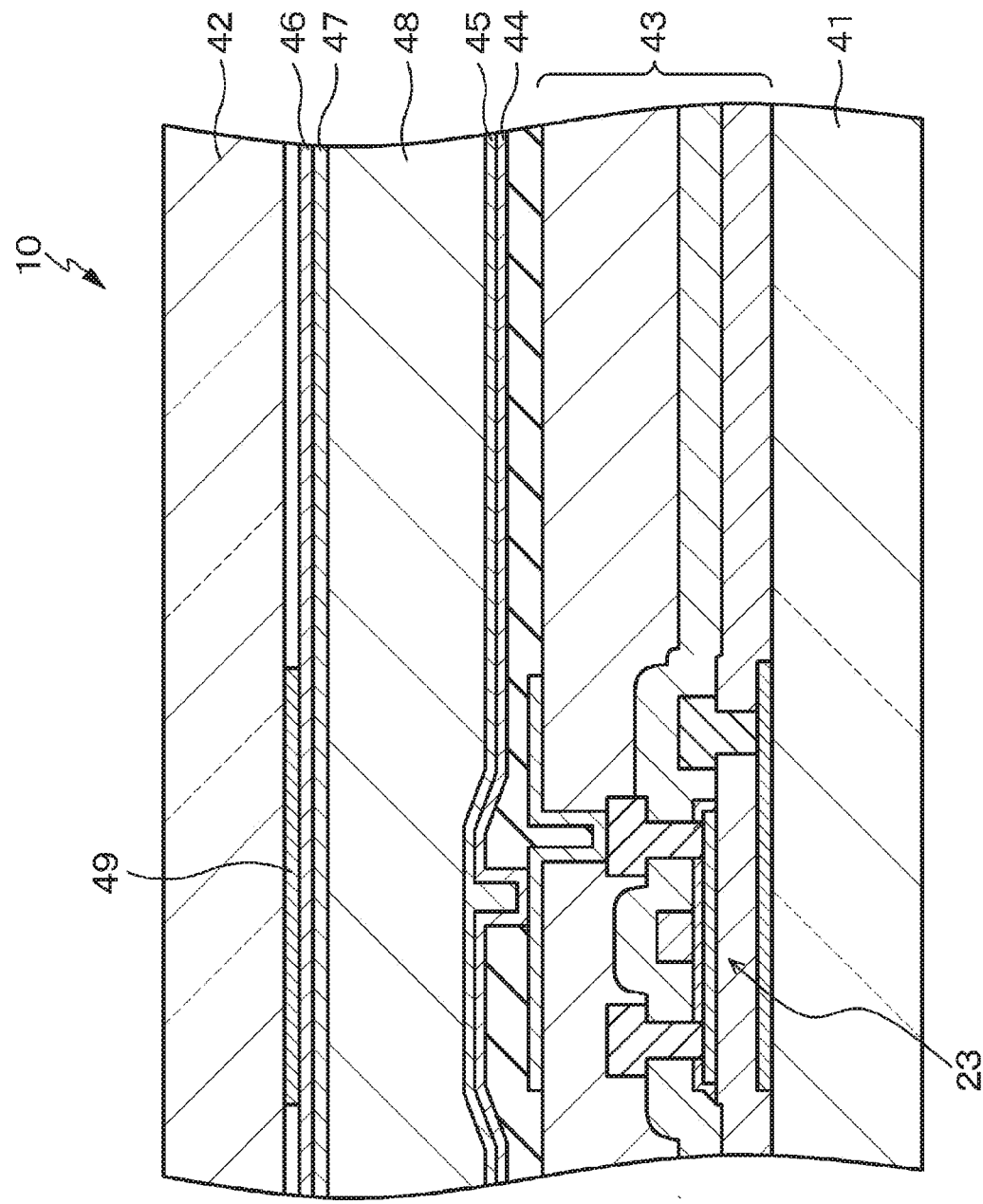

STATE IN WHICH CRYSTALLINITY IS RELATIVELY HIGH

STATE IN WHICH CRYSTALLINITY IS RELATIVELY LOW

FIG. 16
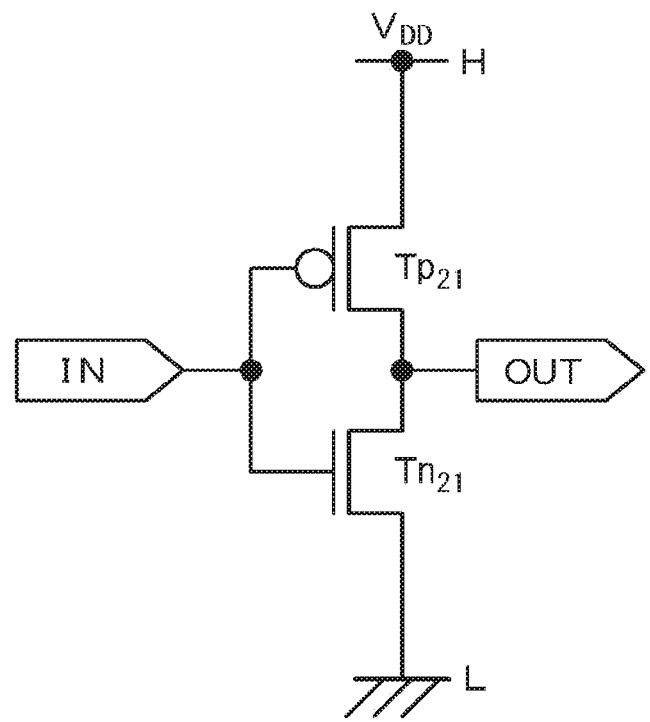

FIG. 17
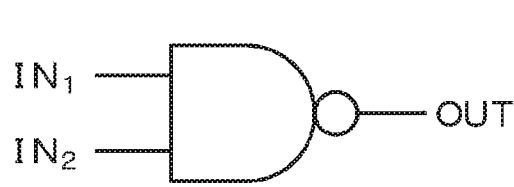
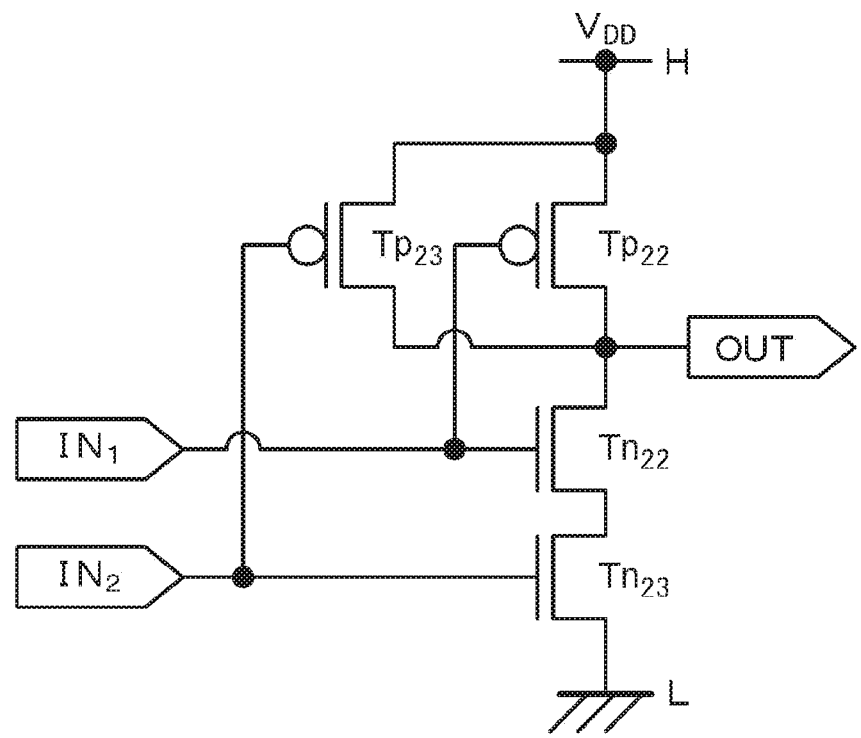

FIG. 18
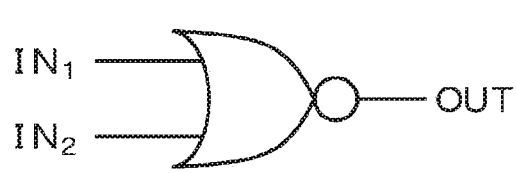
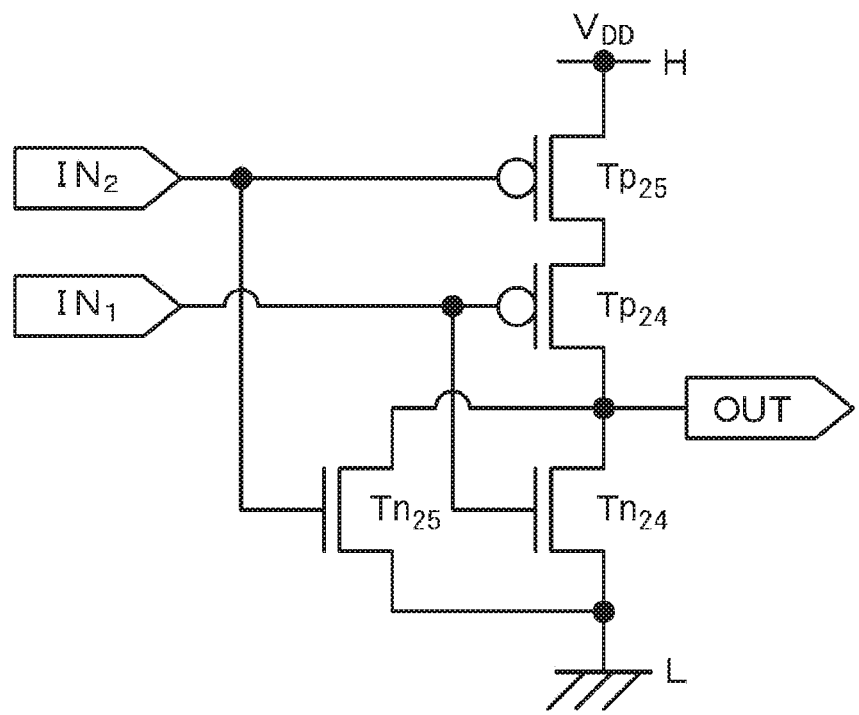

DISPLAY DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/002033 having an international filing date of 23 Jan. 2019, which designated the United States, which PCT application claimed the benefit of Japanese Patent Application No. 2018-023696 filed 14 Feb. 2018, the entire disclosures of each of which are incorporated herein by reference.

TECHNICAL FIELD

The present disclosure relates to a display device and an electronic apparatus.

BACKGROUND ART

Liquid crystal display devices, which are examples of display devices, include a transmissive type and a reflective type, and both of the types generate heat by receiving light from a light source. There is a demand for higher luminance as a trend common to a variety of liquid crystal display devices used for projection type display devices (projectors), televisions, smartphones, and the like. As the luminance is enhanced and the amount of light from the light source is expanded, the heat generation due to light absorption keeps growing larger. Then, when the temperature of the liquid crystal display device rises, an image quality defect occurs.

For this reason, good image quality is maintained by grasping the temperature of the liquid crystal display device with a temperature sensor and feeding the grasped temperature back to a cooling or image quality correction system. As a temperature sensor that measures the temperature of the liquid crystal display device, there is known a temperature sensor having a configuration in which a ring oscillator made up of an odd number of inverters connected in series is used and the temperature is sensed by a change in the oscillation frequency of the ring oscillator (for example, see Patent Document 1).

CITATION LIST

Patent Document

Patent Document 1: Japanese Patent Application Laid-Open No. 2000-009547

SUMMARY OF THE INVENTION

Problems to be Solved by the Invention

In the prior art described in Patent Document 1, a ring oscillator is formed in parallel in the same process using the same material as those of a thin film transistor for a driving circuit. Incidentally, since higher performance is required for the driving circuit for driving a pixel, generally, it is aimed to make the crystallinity of a channel portion of the thin film transistor higher.

However, in general, the lower the crystallinity of the channel portion, the more incomplete the transistor characteristics and the higher the temperature dependence. Therefore, in a case where the ring oscillator is formed in parallel in the same process using the same material as those of a transistor for a driving circuit for which higher performance is required, the temperature dependence is made lower, and the temperature measurement accuracy cannot be raised.

Thus, an object of the present disclosure is to provide a display device including a temperature sensor circuit capable of raising the temperature measurement accuracy and more precisely grasping the temperature, and an electronic apparatus including the display device.

Solutions to Problems

A display device of the present disclosure for achieving the above object is a display device including
a pixel array unit made up of pixels disposed on a substrate;
a peripheral circuit unit that is disposed in a periphery of the pixel array unit and drives the pixels; and
a temperature sensor circuit disposed on the same substrate as the pixel array unit. This display device has a configuration in which
the temperature sensor circuit is configured using a circuit having a temperature dependence, and
crystallinity of a channel portion of a transistor constituting the temperature sensor circuit is different from crystallinity of a channel portion of a transistor constituting the peripheral circuit unit.

Furthermore, an electronic apparatus according to the present disclosure to achieve the above object has a configuration including the display device having the above configuration.

BRIEF DESCRIPTION OF DRAWINGS

FIG. 1 is a block diagram schematically illustrating a system configuration of a liquid crystal display device according to embodiments of the present disclosure.

FIG. 3 is a cross-sectional view illustrating an example of a cross-sectional structure of a main part of the liquid crystal panel.

FIG. 11A illustrates a first specific example of the select circuit, FIG. 11B illustrates a second specific example of the select circuit, and FIG. 11C illustrates a select circuit of a third specific example.

FIG. 16 is a diagram illustrating a MIL symbol, a truth table, and a circuit example of an inverter circuit according to a seventh working example.

FIG. 17 is a diagram illustrating a MIL symbol, a truth table, and a circuit example of a NOT-AND (NAND) circuit according to the seventh working example.

FIG. 18 is a diagram illustrating a MIL symbol, a truth table, and a circuit example of a NOT-OR (NOR) circuit according to the seventh working example.

FIG. 22A illustrates a first specific example of the electric shield structure, FIG. 22B illustrates a second specific example of the electric shield structure, and FIG. 22C illustrates a third specific example of the electric shield structure.

MODE FOR CARRYING OUT THE INVENTION

Figure 2A:
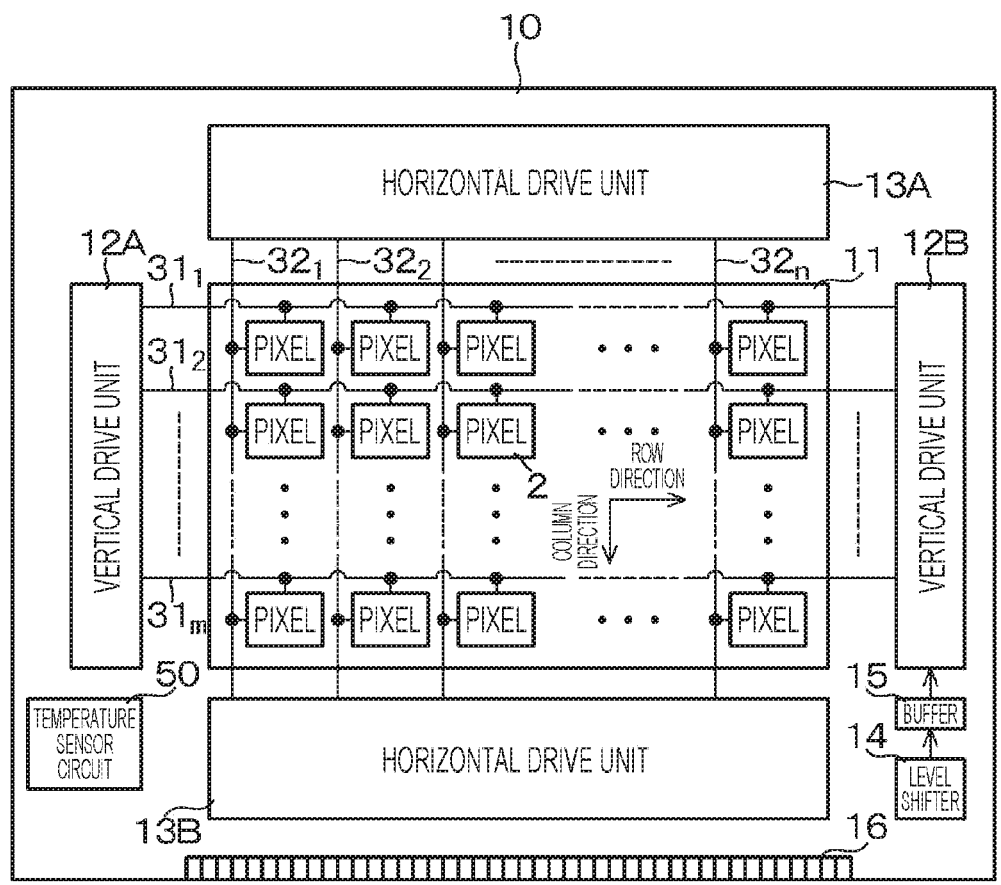
FIG. 2A is a block diagram illustrating an example of a configuration of a liquid crystal panel of an active matrix technique.

Modes for carrying out a technology according to the present disclosure (hereinafter, stated as "embodiments") will be described below in detail with reference to the drawings. The technology according to the present disclosure is not limited to the embodiments and various numerical values, materials, and the like used in the embodiments serve as examples. In the following description, the same reference numerals will be used for the same elements or elements having the same functions and duplicated description will be omitted. Note that the description will be given in the following order.

1. Description of Display Device and Electronic Apparatus according to Present Disclosure and Overall Description
2. Liquid Crystal Display Device according to Embodiments of Present Disclosure
  2-1. System Configuration Example
  2-2. Configuration Example of Liquid Crystal Panel
  2-3. Circuit Example of Pixel
  2-4. Cross-Sectional Structure Example of Liquid Crystal Panel
  2-5. Configuration Example of Panel Module
  2-6. Regarding Temperature Change in Liquid Crystal Panel
    2-6-1. Heat Generation due to Light Absorption
    2-6-2. Heat Generation due to Driving of Peripheral Circuit Unit
    2-6-3. Heat Radiation by Cooling
  2-7. Difficulties due to High Temperature of Liquid Crystal Panel
  2-8. Description of Embodiments
    2-8-1. First Working Example (Example in which Temperature Sensor Circuit is made up of Delay Circuit)
    2-8-2. Second Working Example (Modification of First Working Example: Example in which Delay Amount is Variable)
    2-8-3. Third Working Example (Specific Example of Select Circuit used in Delay Circuit with Variable Delay Amount)
    2-8-4. Fourth Working Example (Example in which Temperature Sensor Circuit is made up of Ring Oscillator)

2-8-5. Fifth Working Example (Modification of Fourth Working Example: Example in which Output Frequency is Variable)
2-8-6. Sixth Working Example (Example in which Temperature Sensor Circuit is made up of Combination of Delay Circuit and Ring Oscillator)
2-8-7. Seventh Working Example (Example of Variations of Circuit Configuration of Logic Circuit)
2-8-7-1. Example of CMOS Logic Circuit
2-8-7-2. Example of NMOS Single Logic Circuit
2-8-7-3. Example of PMOS Single Logic Circuit
2-8-8. Eighth Working Example (Example of Transistor Structure for Countermeasure against Leakage Current due to Light)
2-8-9. Ninth Working Example (Example of Electric Shield Structure to Suppress Influence to Periphery)
2-8-10. Tenth Working Example (Example of Any-Time Calibration at One Point of Linear Characteristics)
2-8-10-1. First Example (Case of Delay Circuit)
2-8-10-2. First Example (Case of Ring Oscillator)
2-8-11. Eleventh Working Example (Example of Any-Time Calibration at Plurality of Points of Linear Characteristics)
3. Modifications
4. Electronic Apparatus of Present Disclosure (Example of Projection Type Display Device)
5. Configurations that Present Disclosure can take <Description of Display Device and Electronic Apparatus According to Present Disclosure and Overall Description>

A display device and an electronic apparatus of the present disclosure can have a configuration in which crystallinity of a channel portion of a transistor constituting a temperature sensor circuit is lower than crystallinity of a channel portion of a transistor constituting a peripheral circuit unit.

The display device and the electronic apparatus of the present disclosure including the above-described preferred configuration can have a configuration in which the temperature sensor circuit is disposed in a region apart by a predetermined distance from a region where a circuit portion of the peripheral circuit unit that generates significant heat is disposed, or a configuration in which the temperature sensor circuit is disposed in a region on an opposite side of a region where a circuit portion of the peripheral circuit unit that generates significant heat is disposed, with the pixel array unit interposed between the temperature sensor circuit and the circuit portion.

Furthermore, the display device and the electronic apparatus of the present disclosure including the above-described preferred configuration can have a configuration in which the transistor constituting the temperature sensor circuit has a light-shielding structure that shields at least the channel portion from light. At this time, a configuration can be adopted in which the light-shielding structure is formed by metal layers provided so as to cover upper and lower portions of the transistor constituting the temperature sensor circuit, and moreover, is formed so as to make a wall on a side surface side by a contact electrode.

Moreover, the display device and the electronic apparatus of the present disclosure including the above-described preferred configuration can have a configuration including a temperature detection circuit that detects a temperature of a panel made up of the pixel array unit and the peripheral circuit unit disposed on the panel, in accordance with a measurement signal of the temperature sensor circuit. At this time, it is preferred that an output wire that transfers the measurement signal of the temperature sensor circuit to the temperature detection circuit have an electric shield structure. A configuration can be adopted in which the temperature detection circuit is provided on an external substrate electrically connected to the panel made up of the pixel array unit and the peripheral circuit unit disposed on the panel.

Moreover, the display device and the electronic apparatus of the present disclosure including the above-described preferred configuration can have a configuration in which the electric shield structure includes a shield wire provided adjacent to the output wire of the temperature sensor circuit and set to a fixed potential. As the temperature sensor circuit, a single-phase input type circuit or a differential input type circuit can be used. In a case where the temperature sensor circuit is of a single-phase input type, a configuration can be adopted in which an auxiliary wire is provided adjacent to the output wire of the temperature sensor circuit, a load corresponding to an input load of the temperature detection circuit is connected to an end portion of the auxiliary wire on a temperature detection circuit side, and the auxiliary wire transfers a signal having a phase reverse to a phase of a signal transferred by the output wire. In a case where the temperature sensor circuit is of a differential input type, a configuration can be adopted in which two output wires are wired in parallel between the temperature sensor circuit and the temperature detection circuit, one of the output wires transfers the measurement signal of the temperature sensor circuit to the temperature detection circuit, and the other of the output wires transfers a signal having a phase reverse to a phase of the measurement signal of the temperature sensor circuit to the temperature detection circuit.

Moreover, the display device and the electronic apparatus of the present disclosure including the above-described preferred configuration can have a configuration in which calibration is performed at one point of temperature dependence linear characteristics of the temperature sensor circuit on the basis of a reference temperature at time of use, or calibration is performed at a plurality of points of temperature dependence linear characteristics of the temperature sensor circuit on the basis of a heat generation state of a heat generation source present near the temperature sensor circuit.

Moreover, the display device and the electronic apparatus of the present disclosure including the above-described preferred configuration can have a configuration in which the circuit having a temperature dependence is made up of a delay circuit, a ring oscillator, or a combination of a delay circuit and a ring oscillator. Then, a configuration can be adopted in which the delay circuit or the ring oscillator has a standby function of turning on and off a circuit operation.

Moreover, the display device and the electronic apparatus of the present disclosure including the above-described preferred configuration can have a configuration including a cooling unit that cools a display panel formed by the pixel array unit, the peripheral circuit unit, and the temperature sensor circuit. Then, it is preferred that the cooling unit control adjustment of a cooling operation on the basis of a temperature of the display panel detected by the temperature sensor circuit.

Moreover, the display device and the electronic apparatus of the present disclosure including the above-described preferred configuration can have a configuration including a signal processing unit that performs signal processing on a video signal that drives a pixel. Then, it is preferred that the signal processing unit control uniformity correction on the video signal on the basis of a temperature of the display panel detected by the temperature sensor circuit.

<Liquid Crystal Display Device According to Embodiments of Present Disclosure>

Hereinafter, the display device of the present disclosure will be described by taking a liquid crystal display device as an example.

Liquid crystal display devices are classified into a transmissive type and a reflective type in terms of display techniques. Then, as a silicon material used for a thin film transistor (TFT) used for a pixel, amorphous silicon (amorphous semiconductor) or polysilicon (polycrystalline semiconductor) is often used in a transmissive liquid crystal display device. In a reflective liquid crystal display device, single crystal silicon is often used. Note that polysilicon is classified into a high-temperature polysilicon (HTPS) that forms a thin film in a high-temperature environment of 1000 degrees Celsius or higher, and a low-temperature polysilicon (LTPS) that forms a thin film in a low-temperature environment of 600 degrees Celsius or lower.

In a liquid crystal panel (display panel), a substrate such as a quartz substrate, a glass substrate, or a silicon substrate is used as a substrate on which pixels are formed. Generally, a glass substrate is used for an amorphous silicon transmissive liquid crystal panel and a low-temperature polysilicon transmissive liquid crystal panel, a quartz substrate is used for a high-temperature polysilicon transmissive liquid crystal panel, and a silicon substrate is used for a single crystal silicon reflective liquid crystal panel.

There are a twisted nematic (TN) mode, a vertical alignment (VA) mode, and an in-plane switching (IPS) mode for liquid crystal materials mainly used for product manufacturing, and there are high-temperature polysilicon, low-temperature polysilicon, and amorphous silicon (a-Si) for TFT processes. In a liquid crystal panel for a projection type display device (projector), the VA mode is often selected for a liquid crystal material, and high-temperature polysilicon (HTPS) is often selected for a TFT process (so-called HTPS liquid crystal panel). In a direct-view liquid crystal panel of a small and medium size of about three inches to ten inches for a smartphone and the like, the VA mode or the IPS mode is often selected for a liquid crystal material, and low-temperature polysilicon (LTPS) is often selected for a TFT process (so-called LTPS liquid crystal panel). In a large direct-view liquid crystal panel of ten inches or greater for a television, a personal computer, and the like, the VA mode or the IPS mode is often selected for a liquid crystal material, and amorphous silicon is often selected for a TFT process (so-called aSi liquid crystal panel).

The technology of the present disclosure described below, that is, the technology of a liquid crystal display device according to the embodiments of the present disclosure can be applied to a transmissive liquid crystal display device and can also be applied to a reflective liquid crystal display device.

System Configuration Example

FIG. 1 is a block diagram schematically illustrating a system configuration of a liquid crystal display device according to embodiments of the present disclosure. As illustrated in FIG. 1, a liquid crystal display device 1 according to the present embodiments has a configuration including a liquid crystal panel 10, a signal processing unit 20, a digital-to-analog (DA) conversion unit 30, and a cooling unit 40. Details of the configuration of the liquid crystal panel 10 will be described later.

The signal processing unit 20 is made up of, for example, a digital signal driver (DSP) circuit, and conducts signal processing necessary for liquid crystal display, such as gamma correction and color unevenness correction, on a digital input video signal, to supply the converted digital input video signal to the DA conversion unit 30 as a panel video signal. The signal processing unit 20 further supplies the liquid crystal panel 10 with high-level/low-level two-potential panel control signals such as various timing signals and clock signals necessary for driving the liquid crystal panel 10.

The DA conversion unit 30 is made up of, for example, a sample hold driver (SHD) circuit, and converts a digital video signal subjected to signal processing such as gamma correction and color unevenness correction in the signal processing unit 20 into an analog video signal, to supply the converted analog video signal to the liquid crystal panel 10 as a panel video signal.

The temperature of the liquid crystal panel 10 rises due to various factors (the details of the temperature rise will be described later). Then, when the temperature of the liquid crystal panel 10 rises, an image quality defect occurs. For this reason, the cooling unit 40 for cooling the liquid crystal panel 10 is provided near the liquid crystal panel 10.

Furthermore, the liquid crystal display device 1 according to the present embodiments employs a configuration in which a temperature sensor circuit 50 is built in the liquid crystal panel 10 in order to more precisely grasp the temperature of the liquid crystal panel 10 (hereinafter, sometimes stated as "panel temperature"). Then, the panel temperature is detected by a temperature detection circuit 60 provided outside the liquid crystal panel 10, in accordance with a measurement value by the temperature sensor circuit 50, and the result of the detection is fed back to the cooling unit 40. The detection result of the temperature detection circuit 60 is also fed back to the signal processing unit 20.

Configuration Example of Liquid Crystal Panel

Next, an example of the configuration of the liquid crystal panel 10 will be described. A passive matrix technique or an active matrix technique may be adopted as the pixel driving technique. Hereinafter, the description will be given by taking the active matrix technique as an example. FIG. 2A illustrates an example of the configuration of the liquid crystal panel 10 of the active matrix technique. The liquid crystal panel 10 has a panel structure in which two transparent substrates (not illustrated) are disposed facing each other with a predetermined interval, and a liquid crystal material is enclosed between these two substrates.

As illustrated in FIG. 2A, the liquid crystal panel 10 has a configuration including a pixel array unit 11 obtained by two-dimensionally arranging a plurality of pixels 2 each including a liquid crystal element in a matrix, and a peripheral circuit unit disposed in the periphery of the pixel array unit 11. The peripheral circuit unit is made up of a vertical drive unit 12A, a vertical drive unit 12B, a horizontal drive unit 13A, a horizontal drive unit 13B, a level shifter 14, a buffer 15, and the like, and is integrated on the same substrate as the pixel array unit 11 to drive each pixel 2 of the pixel array unit 11. Furthermore, the liquid crystal panel 10 includes a terminal unit 16 for inputting a signal from the outside and outputting a signal to the outside. A flexible substrate 17 (see FIG. 23) described later is connected to the terminal unit 16, and the terminal unit 16 is electrically connected to an external substrate 18 on which the signal processing unit 20, the temperature detection circuit 60, and the like are mounted (see FIG. 23), via the flexible substrate 17. The precedingly mentioned temperature sensor circuit 50 for grasping the temperature of the liquid crystal panel 10 is further built in the liquid crystal panel 10.

In the pixel array unit 11, scanning lines $31_1$ to $31_m$ (hereinafter, sometimes collectively stated as "scanning lines 31") are wired along a row direction for each pixel row in a pixel arrangement in a matrix. Furthermore, signal lines $32_1$ to $32_n$ (hereinafter, sometimes collectively stated as "signal lines 32") are wired along a column direction for each pixel column. In different terms, the scanning lines $31_1$ to $31_m$ and the signal lines $32_1$ to $32_n$ are wired in a matrix, and the pixel 2 is formed at each intersection portion between the scanning lines $31_1$ to $31_m$ and the signal lines $32_1$ to $32_n$.

In the peripheral circuit unit, the vertical drive units 12A and 12B are provided to be connected to respective two end portions (left and right two end portions) of the scanning lines $31_1$ to $31_m$. Here, a configuration in which the vertical drive units 12A and 12B are disposed on the respective two end portion sides of the scanning lines $31_1$ to $31_m$ is exemplified; however, a configuration in which the vertical drive unit is disposed only on one end portion side of each of the scanning lines $31_1$ to $31_m$ may be adopted. The vertical drive units 12A and 12B are constituted by a shift register and the like, and output, to the scanning lines $31_1$ to $31_m$, a scanning signal for driving when writing the video signal to the pixel 2.

The horizontal drive units 13A and 13B are provided to be connected to respective two end portions (upper and lower two end portions) of the signal lines $32_1$ to $32_n$. Here, a configuration in which the horizontal drive units 13A and 13B are disposed on the respective two end portion sides of the signal lines $32_1$ to $32_n$ is exemplified; however, a configuration in which the horizontal drive unit is disposed only on one end portion side of each of the signal lines $32_1$ to $32_n$ may be adopted. The horizontal drive units 13A and 13 output, to the signal lines $32_1$ to $32_n$, a video signal to be written to each pixel 2 in a pixel row (selected row) selected by the vertical drive units 12A and 12B.

The driving technique for writing the video signal to the pixel 2 may be dot-sequential driving that writes the video signal to each pixel 2 in the selected row in pixel units, or may be line-sequential driving that writes the video signal to each pixel 2 in the selected row in pixel row units.

The level shifter 14 is a circuit that performs level conversion in the panel for a control signal input from the outside through the terminal unit 16, for example, from 0 V/3 V amplitude to 0 V/10 V amplitude that drives the vertical drive units 12A and 12B and the horizontal drive units 13A and 13B. As the level shifter 14, a current mirror type level shift circuit is generally used. In the current mirror type level shift circuit, a through current flows. Then, as the amplitude difference of the level conversion is greater, a larger current is consumed as the through current.

The buffer 15 is a circuit that raises the drive capability of the control signal (pulse signal) after the level conversion in the level shifter 14. A buffer of the buffer 15 in the last stage drives a wire with a large load capacitance routed to the vertical drive units 12A and 12B and the horizontal drive units 13A and 13B. A current is consumed for charging and discharging this load capacitance, and the higher the driving frequency is, the larger the consumed current is.

In the liquid crystal panel 10 having the above configuration, the peripheral circuit unit including the vertical drive units 12A and 12B, the horizontal drive units 13A and 13B, the level shifter 14, the buffer 15, and the like is configured using, for example, a thin film transistor.

Circuit Example of Pixel

Figure 2B:
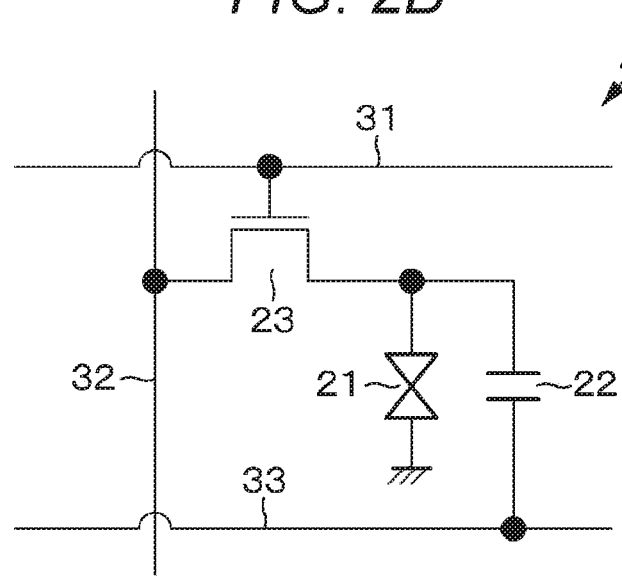
FIG. 2B is an equivalent circuit diagram illustrating an example of a circuit configuration of a pixel.

Next, an example of a circuit of the pixel 2 will be described. FIG. 2B illustrates an example of a circuit configuration of the pixel 2. As illustrated in the equivalent circuit diagram in FIG. 2, the pixel 2 has a configuration including a liquid crystal element 21, a capacitive element 22, and a pixel transistor 23.

One electrode of the liquid crystal element 21 is an independent electrode for each pixel 2 (a pixel electrode 44 in FIG. 3), and is connected to one electrode of the pixel transistor 23 (for example, a drain electrode) and one electrode of the capacitive element 22. Another electrode of the liquid crystal element 21 is an electrode common to all the pixels 2 (a counter electrode 46 in FIG. 3), and is, for example, grounded.

The capacitive element 22 is an element for stabilizing the charge stored in the liquid crystal element 21. One electrode of the capacitive element 22 is connected to the one electrode of the liquid crystal element 21 (pixel electrode 44) and the one electrode of the pixel transistor 23. Another electrode of the capacitive element 22 is connected to a capacitance line 33.

The pixel transistor 23 is an element for writing the video signal to the liquid crystal element 21, and is made up of a thin film transistor. The pixel transistor 23 has a gate electrode connected to the scanning line 31, the one electrode connected to the one electrode of the liquid crystal element 21 and the one electrode of the capacitive element 22, and another electrode (for example, a source electrode) connected to the signal line 32.

Cross-Sectional Structure Example of Liquid Crystal Panel

Next, an example of a cross-sectional structure of the liquid crystal panel 10 will be described. FIG. 3 illustrates an example of a cross-sectional structure of a main part of the liquid crystal panel 10.

The liquid crystal panel 10 includes a plurality of the pixels 2 each including the liquid crystal element 21, between a first substrate 41 and a second substrate 42 disposed to face each other. Specifically, a pixel circuit layer 43 including the pixel transistor 23 is provided on the first substrate 41, and the pixel electrode 44 is provided for each pixel 2 on this pixel circuit layer 43. This pixel electrode 44 is electrically connected to the pixel transistor 23. An alignment film 45 is formed on the pixel electrode 44.

On a surface of the second substrate 42 facing the first substrate 41, the counter electrode 46 is provided in common for all pixels. Furthermore, an alignment film 47 is formed so as to cover an outer surface of the counter electrode 46. Then, a liquid crystal material is sealed between the alignment films 45 and 47 to form a liquid crystal layer 48. In addition, a region between the pixels 2 is shielded from light by a light-shielding film 49 provided on the second substrate 42. Note that a polarizing plate (not illustrated) is provided by being affixed on each of a light incident surface of the first substrate 41 and a light emitting surface of the second substrate 42. Additionally, a microlens array may be formed on a light emitting surface side of the second substrate 42.

The first substrate 41 and the second substrate 42 are each constituted by a substrate such as a quartz substrate, a glass substrate, or a silicon substrate. The pixel electrode 44 and the counter electrode 46 are each constituted by, for example, a transparent conductive film made by indium tin oxide (ITO) or the like. The alignment films 45 and 47 are each constituted by, for example, an insulating film made by polyimide or the like. The liquid crystal layer 48 is constituted by, for example, a vertical alignment (VA) mode or twisted nematic (TN) mode liquid crystal material. The light-shielding film 49 has an opening for each pixel 2, for example, and these openings have a lattice shape in plan view.

Configuration Example of Panel Module

Figure 4:
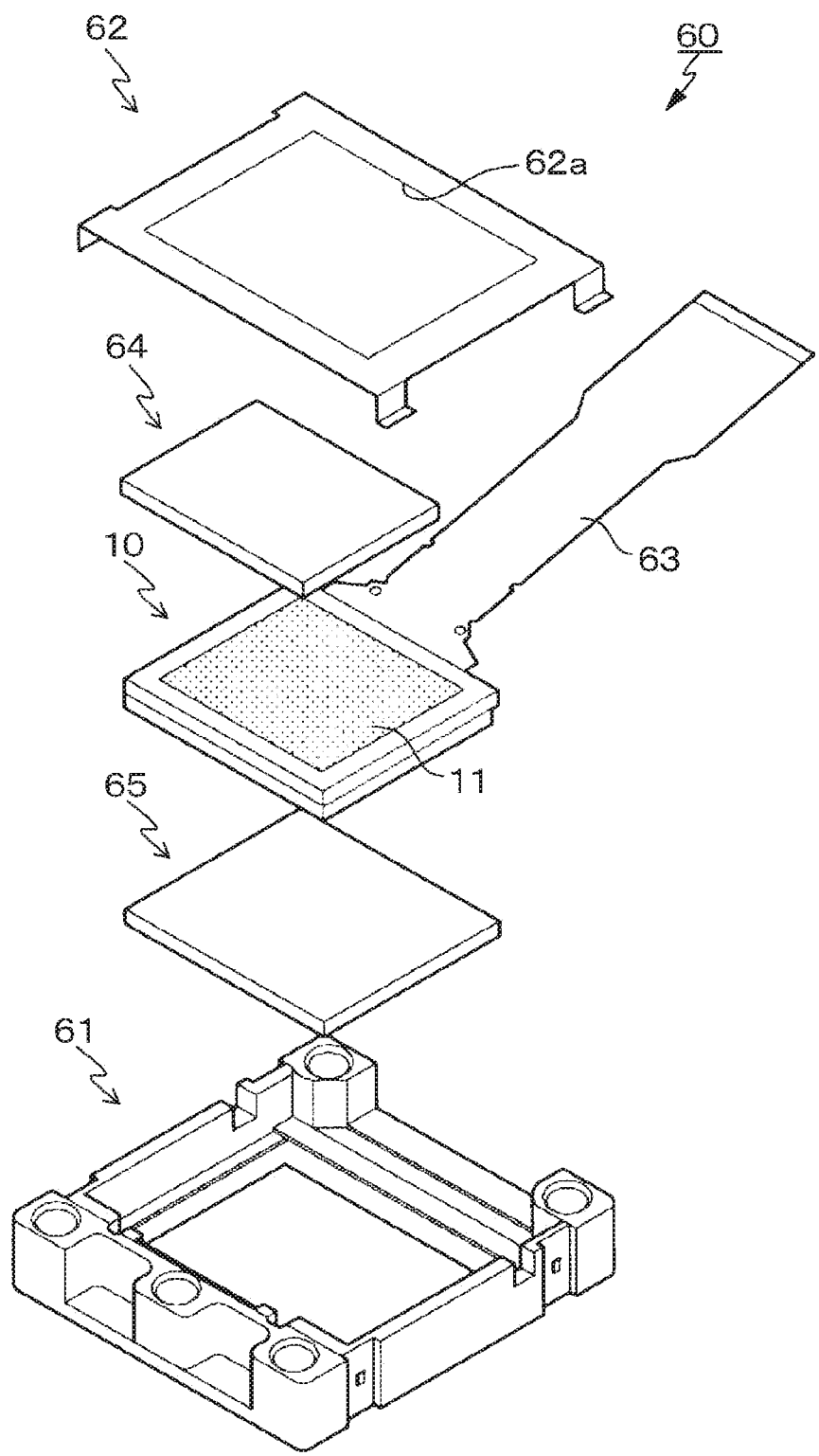
FIG. 4 is an exploded perspective view illustrating an example of a configuration of a panel module including the liquid crystal panel.

Next, an example of a configuration of a panel module including the liquid crystal panel 10 having the above-described configuration will be described. FIG. 4 is an exploded perspective view illustrating an example of a configuration of a panel module including the liquid crystal panel 10.

The panel module 60 includes the liquid crystal panel 10, and an outer frame 61 and a parting plate 62 that house or sandwich the liquid crystal panel 10. A film substrate 63 is electrically connected to the liquid crystal panel 10, and the video signal is input from the outside through this film substrate 63.

An incident-side dust-proof glass 64 is affixed to a light incident side of the liquid crystal panel 10, and an emission-side dust-proof glass 65 is affixed to a light emitting side of the liquid crystal panel 10. The parting plate 62 is equipped on a light incident surface side of the liquid crystal panel 10, and has an opening portion 62a facing the pixel array unit 11, that is, the display region of the liquid crystal panel 10. The outer frame 61 is made up of, for example, a metal frame, has a frame shape surrounding an end surface portion of the liquid crystal panel 10, and is attached to a light emitting side of the liquid crystal panel 10.

[Regarding Temperature Change in Liquid Crystal Panel]
(Heat Generation Due to Light Absorption)

The liquid crystal panel 10 receives light from a light source and generates heat regardless of whether the liquid crystal panel 10 is of a transmissive type or a reflective type. Furthermore, the lower the transmittance, the greater the heat generation. As factors for the transmittance, the aperture ratio of pixel of the liquid crystal panel 10, the transmittance of members, and the like can be cited. There is a demand for higher luminance as a trend common to all liquid crystal display devices used for projectors, televisions, smartphones, and the like, and heat generation due to light absorption keeps growing larger.

When a liquid crystal material is heated to a high temperature, the liquid crystal material undergoes a phase transition (at a nematic-isotropic (ni) point) and becomes a liquid. When a liquid is produced, the transmittance can be no longer controlled by the electric field, and the function as a display device is lost; for this reason, the use at the phase transition point or lower is essential. The phase transition point differs depending on the liquid crystal material. Therefore, it is necessary to cool the liquid crystal panel 10 in order to keep the liquid crystal panel 10 at the phase transition point or lower. Furthermore, when light impinges on a channel portion of the pixel transistor 23, the leakage current increases, such that the ability to hold the pixel potential is deteriorated, which leads to the degradation in image quality.

(Heat Generation Due to Driving of Peripheral Circuit Unit)

Besides the heat generation due to light absorption as described above, as factors for heat generation in the liquid crystal panel 10, heat generation due to driving of the peripheral circuit unit that drives the pixels of the liquid crystal panel 10 can be cited. Specifically, the liquid crystal display device 1 has a drive mode switching function between, for example, 2D drive, 3D drive, 2D pseudo high definition drive (2-way, 4-way), and 3D pseudo high definition drive (2-way, 4-way). In line with this switching between the drive modes, the frame frequency is changed in the liquid crystal panel 10 between 60 fps, 120 fps, 180 fps, and 240 fps in this order. The higher the frame frequency, the higher the driving frequency of the liquid crystal panel 10 and the larger the amount of heat generation in the peripheral circuit unit.

(Heat Radiation by Cooling)

As described above, the liquid crystal panel 10 has a difficulty in that the panel temperature becomes higher due to light absorption, driving of the peripheral circuit unit, and the like. This is a common difficulty for all the liquid crystal panels 10. In the case of a reflective liquid crystal panel, a cooling framework can be assembled over the entire back surface of the panel; however, in the case of a transmissive liquid crystal panel, since it is necessary to transmit light, a cooling framework cannot be assembled over the entire back surface of the panel.

The transmitted light is absorbed by wires, an insulating film material, and a liquid crystal material, such that the liquid crystal panel 10 generates heat. In the panel module 60, since a peripheral portion of the liquid crystal panel 10 is in contact with the outer frame 61 (see FIG. 4) made up of a metal frame, heat in the peripheral portion of the panel can be radiated through the outer frame 61; however, it is difficult to cool a central portion of the panel to be heated the most. In general, as illustrated in FIG. 1, the cooling unit 40 is provided near the liquid crystal panel 10 such that the liquid crystal panel 10 is cooled by the cooling unit 40.

As a cooling technique of the cooling unit 40, an air cooling technique and a liquid cooling technique are representative. In the air cooling technique, wind is blown by a fan to the panel module 60 including the liquid crystal panel 10 to cool a display surface (glass surface) and a frame (the material is diverse, including metal, ceramic, resin, plastic, and the like) of the panel module 60. In the liquid cooling technique, the liquid crystal panel 10 is cooled by circulating a cooling liquid cooled by a cooling element. There are a type in which the frame is cooled with a cooling liquid, a type in which a panel surface of the liquid crystal panel 10 is cooled, and the like. Furthermore, there is also a hybrid type in which the atmosphere (air) near the panel module 60 is cooled with a cooling liquid, and the obtained cooled air is brown by a fan to the panel module 60 to cool. Additionally, there is also a technique in which some of these techniques are used at the same time.

However, if the cooling unit 40 is always in an activated state irrespective of the air cooling technique or the liquid cooling technique, difficulties such as noise and an increase in power consumption occur. Thus, the liquid crystal display device 1 according to the present embodiments employs a configuration in which the temperature of the liquid crystal panel 10 is more precisely measured by the temperature sensor circuit 50 built in the liquid crystal panel 10, and the result of the measurement is fed back to the cooling unit 40 (see FIG. 1).

(Difficulties Due to High Temperature of Liquid Crystal Panel)

Subsequently, difficulties due to a high temperature because of a rise in the temperature of the liquid crystal panel 10 will be described.

In the liquid crystal panel 10, when the temperature of the pixel transistor 23 becomes higher or light impinges on a channel portion of the pixel transistor 23, a leakage current that flows in an OFF state, namely, so-called OFF leak increases in the pixel transistor 23. If the OFF leak increases in the pixel transistor 23, the pixel potential can be no longer held, and thus the image quality is degraded. Specifically, if the OFF leak amount deviates from pixel to pixel, the transmittance deviates from pixel to pixel, resulting in a rough image quality. Furthermore, when the OFF leak amount is expanded as a whole, the potential difference between the pixels diminishes, and the contrast deteriorates. Moreover, when the OFF leak amount is expanded as a whole, temporal fluctuations in transmittance are caused, and flicker worsens while vertical crosstalk worsens.

Figure 5:
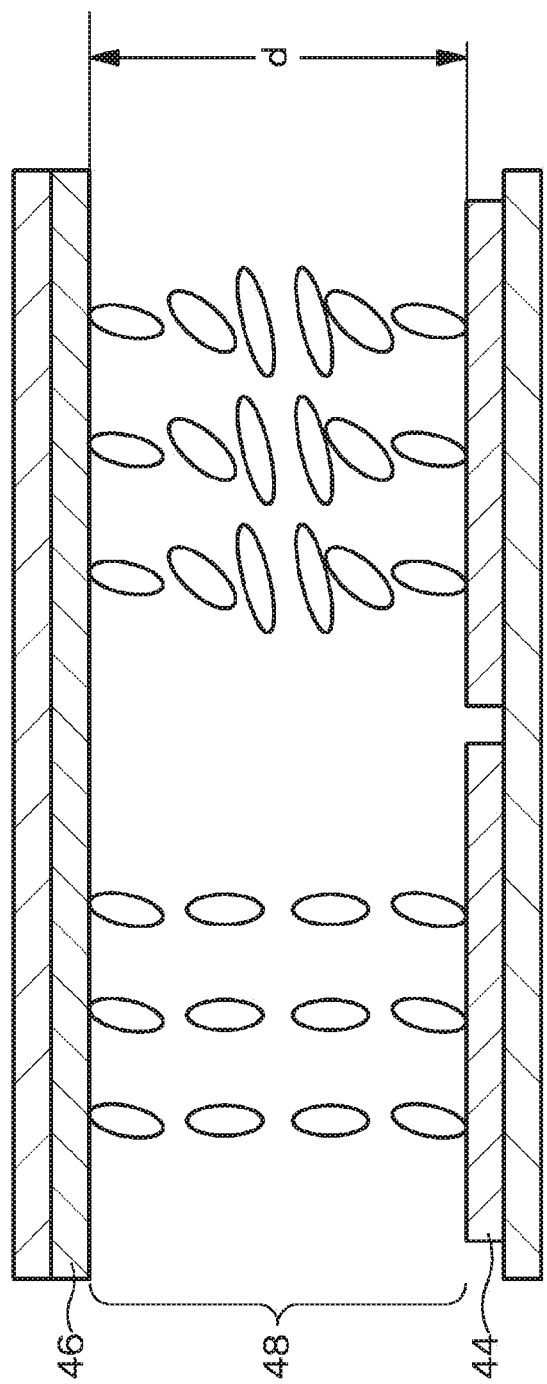
FIG. 5 is a cross-sectional view of a pixel for explaining a gap in the liquid crystal panel.

In addition, when the temperature is high, the liquid crystal swells, a gap in the liquid crystal panel 10 widens, and in-plane gap distribution changes. Here, the gap in the liquid crystal panel 10 is, as illustrated in FIG. 5, a distance between the pixel electrode 44 and the counter electrode 46, in different terms, a thickness d of the liquid crystal layer 48. In the signal processing unit 20 illustrated in FIG. 1, since the color unevenness correction is performed for the in-plane gap distribution at a certain temperature, if the in-plane gap distribution changes due to a temperature change, a mismatch with the color unevenness correction is caused, and in-plane unevenness is conversely emphasized. In other words, if the transmittance at a place where color unevenness correction has been performed on the supposition that the transmittance is low is heightened, the color unevenness correction results in overcorrection, and the in-plane unevenness further worsens.

Furthermore, as described earlier, when the temperature becomes higher and the phase transition (ni point) is exceeded, the transmittance can be no longer controlled by the electric field, and the function as a display device is lost.

DESCRIPTION OF EMBODIMENTS

As is clear from the above description, in the liquid crystal panel 10, the highest temperature is reached at a central portion of the panel. Then, when cooling the liquid crystal panel 10, what is desired to be known is the temperature at a central portion of the panel, where the highest temperature is reached. To more precisely measure the temperature at a central portion of the panel, the temperature sensor circuit 50 is built in the liquid crystal panel 10. Although it is desirable to dispose a temperature sensor in a central portion of the panel, in a transmissive liquid crystal display device, a layout region for the temperature sensor is smaller and it is difficult to realize such disposition because it is desired to make a transmissive portion wider; therefore, more specifically, it can be said that it is best to dispose the temperature sensor in the region of a peripheral portion of the panel where the peripheral circuit unit is formed, having the closest state to the state of the center of the panel. Note that it is also possible to secure the layout area by decreasing the transmittance and place the temperature sensor in the center of the panel. Furthermore, in the reflective liquid crystal display device, since there are few layout restrictions, disposition in the central portion is allowed.

Incidentally, as described earlier, heat generated by driving of the peripheral circuit unit that drives the pixels of the liquid crystal panel 10 is a factor for heat generation in the liquid crystal panel 10. Then, in the peripheral circuit unit, significant heat is generated particularly in the level shifter 14 and the buffer 15 having a large load capacitance, and this heat generation depends on driving conditions such as the driving frequency and the driving amplitude. Since the driving conditions are sometimes switched depending on the set mode (2D mode, 3D mode, and the like), it is necessary to dispose the temperature sensor circuit 50 at a position where the influence of heat generated by these members of the peripheral circuit unit is smaller.

More specifically, it is preferred to dispose the temperature sensor circuit 50 in a region apart from circuit portions of the peripheral circuit unit where significant heat is generated, that is, regions where the level shifter 14 and the buffer 15 are disposed, by a predetermined distance (specifically, a distance where the influence of heat generation is smaller), and the influence of heat generation in these circuit portions where significant heat is generated is smaller. More specifically, as one of the regions where the influence of heat generation in the circuit portions where significant heat is generated is smaller, the position of disposition of the temperature sensor circuit 50 illustrated in FIG. 2A, that is, a region on an opposite side of a region where the level shifter 14 and the buffer 15 are disposed, with the pixel array unit 11 interposed between the temperature sensor circuit 50 and the level shifter 14 and the buffer 15 can be cited. This region is apart from the level shifter 14 and the buffer 15, which are heat generation sources, and is hardly affected by heat generated by the level shifter 14 and the buffer 15. Therefore, the temperature sensor circuit 50 can more precisely measure the temperature at a central portion of the panel without being affected by heat generated by the level shifter 14 and the buffer 15.

Figure 6A:
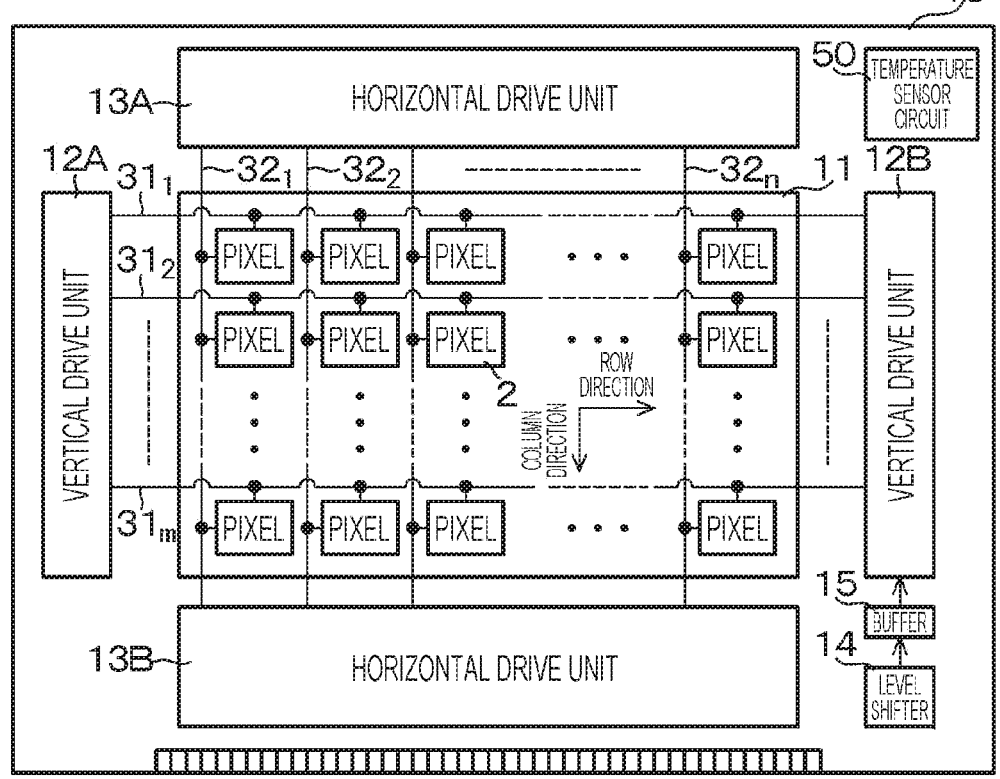
FIGS. 6A and 6B are diagrams illustrating other examples of a position where a temperature sensor circuit is disposed.
Figure 6B:
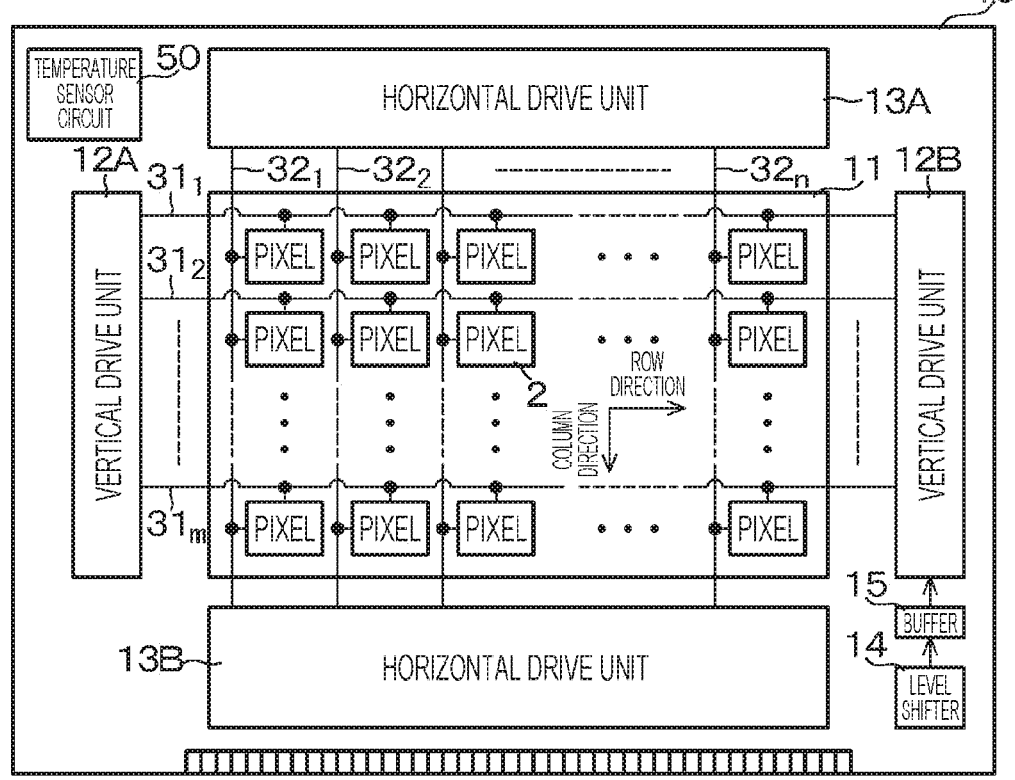

However, a position where the temperature sensor circuit 50 is disposed is not limited to the position of disposition illustrated in FIG. 2A. For example, as illustrated in FIG. 6A, a region on an opposite side of a region where the level shifter 14 and the buffer 15 are disposed, with the vertical drive unit 12B interposed between the level shifter 14 and the buffer 15, and the temperature sensor circuit 50 can be adopted as a position where the temperature sensor circuit 50 is disposed. Alternatively, as illustrated in FIG. 6B, a region diagonal to (a region on an opposite side of) a region where the level shifter 14 and the buffer 15 are disposed, with the pixel array unit 11 interposed between the level shifter 14 and the buffer 15, and the temperature sensor circuit 50 can also be adopted as a position where the temperature sensor circuit 50 is disposed. This region is a region on the liquid crystal panel 10 more apart from the level shifter 14 and the buffer 15, which are heat generation sources, such that the measurement accuracy for the temperature at a central portion of the panel can be raised. Furthermore, the temperature sensor circuit 50 may be disposed at a plurality of locations.

Incidentally, when measuring the temperature of the liquid crystal panel 10, generally, it is simple to measure the temperature with an external thermocouple, which is easy to handle. However, in the case of a liquid crystal panel 10 in which a thin film transistor or a wire serving as a heat generation source is sandwiched between quartz materials having low heat conductivity, a temperature sensor built in the liquid crystal panel 10 can more precisely measure the panel temperature.

The temperature sensor circuit built in the liquid crystal panel 10 can be classified into two types: a type that directly measures a change in characteristics of the element, and a type that measures a change in characteristics of a circuit incorporating the element. Since the temperature sensor circuit that directly measures a change in characteristics of the element measures an analog minute current, the measurement system is expensive.

On the other hand, the temperature sensor circuit that measures a change in characteristics of a circuit incorporating the element can be configured using a circuit having a temperature dependence, for example, an inverter circuit made up of a plurality of inverters. As a circuit having a temperature dependence, that is, an inverter circuit made up of a plurality of inverters, a delay circuit, a ring oscillator, or a combination circuit of a delay circuit and a ring oscillator can be exemplified. Since both of the delay circuit and the ring oscillator need only measure a digital change, the measurement system can be configured at low cost. For example, it is only required to detect a change in pulse from high level to low level or from low level to high level with a general-purpose counter integrated circuit (IC). More specifically, the ring oscillator need only detect the frequency (cycle) of the output pulse directly. The delay circuit need only detect the delay amount (difference) of the output pulse with respect to a reference pulse.

In a case where the temperature sensor circuit 50 built in the liquid crystal panel 10 is configured using an inverter circuit made up of a plurality of inverters (for example, a delay circuit or a ring oscillator), the temperature sensor circuit 50 is configured using a thin film transistor similarly to the peripheral circuit unit such as the vertical drive units 12A and 12B, the horizontal drive units 13A and 13B, the level shifter 14, and the buffer 15.

As for the thin film transistor used for a circuit configuration, in general, the lower the crystallinity of the channel portion, the more incomplete the transistor characteristics and the larger the temperature dependence. Meanwhile, as for the pixel transistor 23 (see FIG. 2B) and the peripheral circuit unit for driving the pixel 2, since higher performance is required, it is aimed to make the crystallinity of the channel portion of the thin film transistor higher, specifically, in polysilicon, it is aimed to enlarge the crystal grain size and put the crystal grains uniformly in a lattice shape.

On the other hand, in the present embodiment, the crystallinity of the channel portion of the thin film transistor constituting the temperature sensor circuit 50 is made lower than the crystallinity of the channel portion of the thin film transistor constituting the peripheral circuit unit, specifically, in polysilicon, the crystal grain size is shrunk and the crystal grains are put at random.

In the silicon crystal formation treatment, ion-implanting silicon into a polysilicon film, breaking the silicon crystal in pieces, and recrystallizing the broken pieces by annealing are repeated, whereby the crystallinity is made higher. Therefore, for example, by reducing the number of times of silicon crystal formation treatment for the temperature sensor circuit 50 with respect to the peripheral circuit unit, the crystallinity of the channel portion of the thin film transistor constituting the temperature sensor circuit 50 can be made lower than the crystallinity of the channel portion of the thin film transistor constituting the peripheral circuit unit.

Figure 7A:
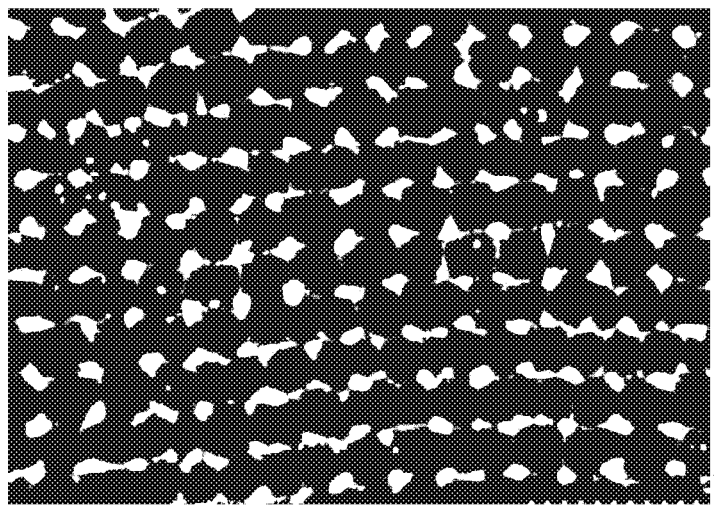
FIG. 7A is a diagram illustrating a grain photograph in a state in which the crystallinity is relatively high.
Figure 7B:
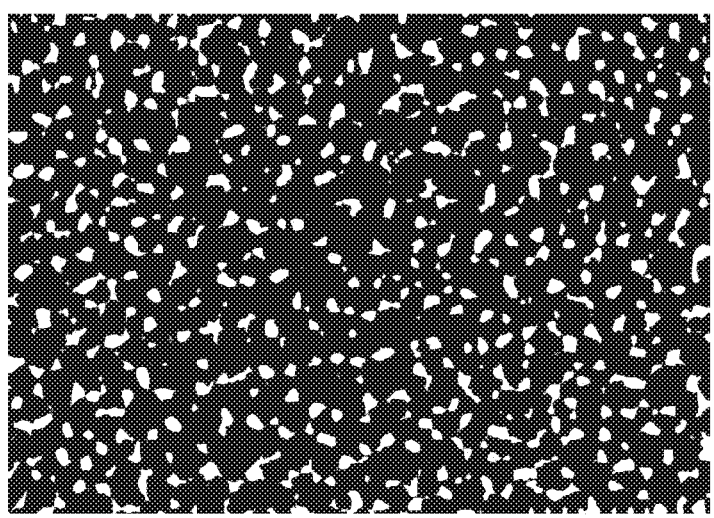
FIG. 7B is a diagram illustrating a grain photograph in a state in which the crystallinity is relatively low.

FIG. 7A illustrates a grain photograph in a state in which the crystallinity is relatively high, and FIG. 7B illustrates a grain photograph in a state in which the crystallinity is relatively low. As is clear from the contrast between the grain photograph in FIG. 7A and the grain photograph in FIG. 7B, the divergence between the high crystallinity state and the low crystallinity state can be found out from the divergence in grain size.

Here, an example of an ion implantation and doping treatment for the thin film transistor (TFT) will be described.

First, boron (B) is implanted into a polysilicon film to form a P-type region, and threshold voltage characteristics ($V_{th}$ characteristics) are controlled. Next, phosphorus (P) is implanted to form a lightly doped drain (LDD) portion. By implanting phosphorus into the drain region at a low concentration, hot carriers generated in the transistor portion are suppressed. Next, for the pixel transistor 23, an N-channel transistor is formed by doping phosphorus and forming N-type source and drain regions. Furthermore, for the transistor of the peripheral circuit unit, a P-channel transistor is formed by doping boron and forming P-type source and drain regions.

As an example, in the case of high-temperature polysilicon, in the crystallization treatment, the state of low crystallinity illustrated in FIG. 7B is produced, and then the state of high crystallinity illustrated in FIG. 7A is produced by injecting silicon. Therefore, after the state of low crystallinity illustrated in FIG. 7B is produced, a thin film transistor constituting the temperature sensor circuit 50 is masked, and silicon is injected into other transistors, specifically, thin film transistors constituting the pixel portion and the peripheral circuit unit; as a consequence, the state of low crystallinity illustrated in FIG. 7B and the state of high crystallinity illustrated in FIG. 7A can be made separately with ease.

As described above, by setting the crystallinity of the channel portion of the thin film transistor constituting the temperature sensor circuit 50 to be lower than the crystallinity of the channel portion of the thin film transistor constituting the peripheral circuit unit, the temperature dependence of the thin film transistor constituting the temperature sensor circuit 50 can be made greater than a case where both of the thin film transistors have the same crystallinity. As a result, the temperature of the liquid crystal panel 10, particularly, the temperature at a central portion of the panel, where the highest temperature is reached, is more precisely detected and grasped owing to the high temperature dependence of the thin film transistor constituting the temperature sensor circuit 50, while the high performance of the peripheral circuit unit is maintained.

In the system configuration in FIG. 1, the panel temperature measured by the temperature sensor circuit 50 and detected by the temperature detection circuit 60 on the basis of the result of the measurement is fed back to the cooling unit 40 and the signal processing unit 20.

The cooling unit 40 controls adjustment of the cooling operation, specifically, adjustment of cooling start and cooling stop, the cooling intensity, and the like, on the basis of the panel temperature fed back from the temperature sensor circuit 50 by way of the temperature detection circuit 60. Owing to this feedback control relating to cooling, the cooling unit 40 is kept away from always being in an activated state, such that difficulties such as noise and an increase in power consumption can be eliminated. Furthermore, it is possible to perform cooling at an optimum intensity corresponding to the temperature of the liquid crystal panel 10, particularly, the temperature at a central portion of the panel, where the highest temperature is reached.

In addition, the signal processing unit 20 performs uniformity correction control on the video signal that drives the pixel 2 of the liquid crystal panel 10 on the basis of the panel temperature fed back from the temperature sensor circuit 50 by way of the temperature detection circuit 60. Normally, the signal processing unit 20 performs uniformity correction for the in-plane gap distribution at a certain temperature. On the other hand, owing to the feedback control relating to the uniformity correction, even if the in-plane gap distribution changes due to a change in panel temperature, the optimum uniformity correction at each temperature can be performed without causing a mismatch with the uniformity correction.

Hereinafter, specific working examples for measuring the temperature of the liquid crystal panel 10 using the temperature sensor circuit 50 built in the liquid crystal panel 10 will be described.

First Working Example

Figure 8:
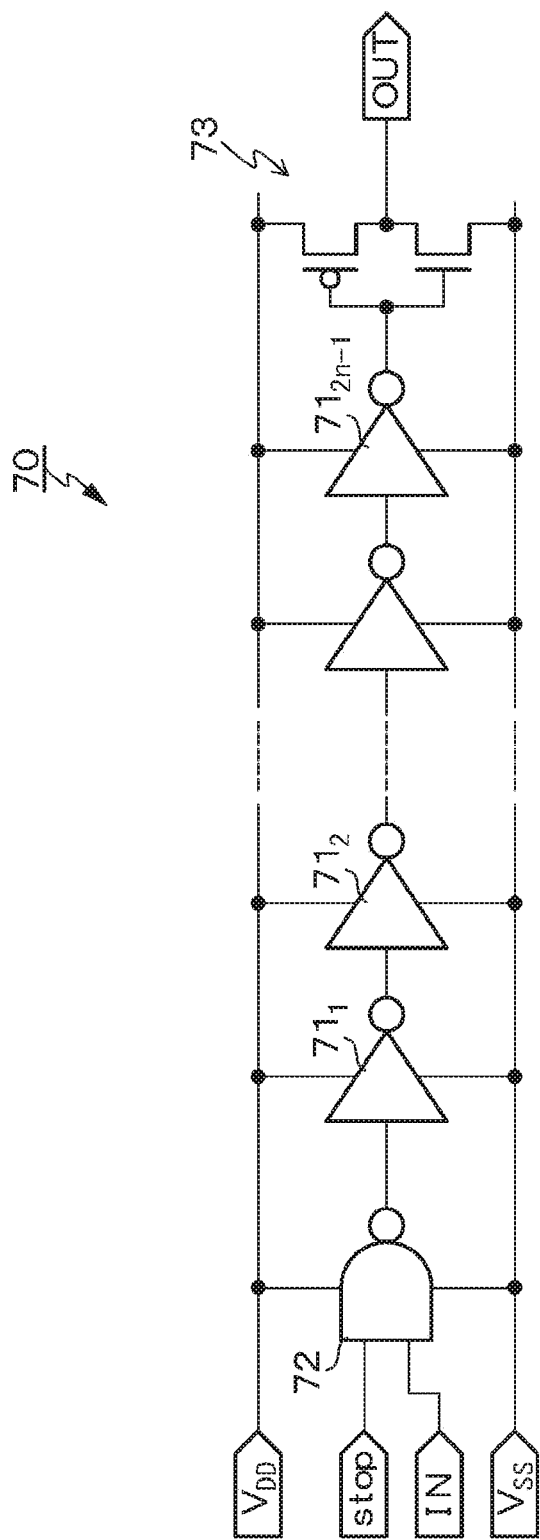
FIG. 8 is a circuit diagram illustrating an example of a circuit configuration of a delay circuit constituting a temperature detection circuit according to a first working example.

A first working example is an example in which the temperature sensor circuit 50, that is, a circuit having a temperature dependence, is made up of a delay circuit. FIG. 8 illustrates an example of a circuit configuration of a delay circuit constituting the temperature sensor circuit 50 according to the first working example.

A delay circuit 70 constituting the temperature sensor circuit 50 according to the first working example has a configuration made up of a total of inverters in n stages, where a plurality of inverters $71_1$ to $71_{2n-1}$ is connected in series between a high-potential-side power supply $V_{DD}$ and a low-potential-side power supply $V_{SS}$, and a two-input NAND circuit 72 is provided as an example of a gate circuit on an input side of the inverter $71_1$ in the first stage. Furthermore, an output buffer 73 made up of a complementary metal oxide semiconductor (CMOS) inverter is provided on an output side of the inverter $71_{2n-1}$ in the last stage.

In the delay circuit 70 having the above configuration, the number of stages of the inverters is, for example, about 50. It is preferred that the number of stages of the inverters be larger, because characteristic deviations are averaged. It is preferred that the potential difference ($V_{DD}$-$V_{SS}$) between the high-potential-side power supply $V_{DD}$ and the low-potential-side power supply $V_{SS}$ be lower because the delay amount of the delay circuit 70 is enlarged.

A predetermined pulse signal IN is input as one input signal for the NAND circuit 72 in the input stage. As the predetermined pulse signal IN, for example, a vertical start pulse VST used in the vertical drive units 12A and 12B and a horizontal start pulse HST used in the horizontal drive units 13A and 13B illustrated in FIG. 2A can be exemplified. Furthermore, a standby control signal stop is input as another input signal for the NAND circuit 72. As the standby control signal stop, a signal that becomes a high level (for example, a $V_{DD}$ level) when the present delay circuit 70 as the temperature sensor circuit 50 measures the temperature of the liquid crystal panel 10, and becomes a low level (for example, a $V_{SS}$ level) when the measurement is not performed can be exemplified.

The NAND circuit 72 in the input stage has a standby function of turning on and off the circuit operation of the present delay circuit 70 by treating the standby control signal stop as the another input signal. By having the standby function, the delay circuit 70 can suppress power consumption when not in use and restrain heat generation due to the circuit operation of the delay circuit 70. Since the temperature sensor circuit 50 also generates heat, it is preferred to measure the temperature after a predetermined time has elapsed after the operation is turned on.

Figure 9A:
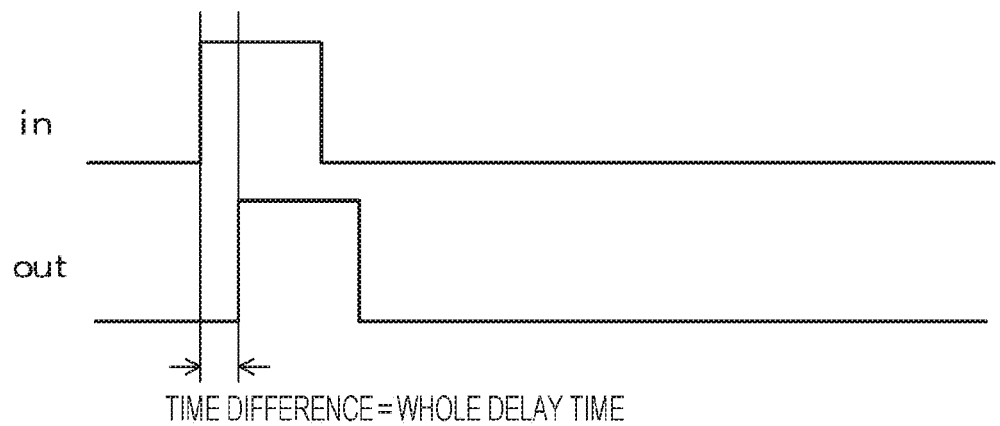
FIG. 9A is a waveform diagram illustrating an input pulse IN of the delay circuit and an output pulse OUT of the delay circuit.
Figure 9B:
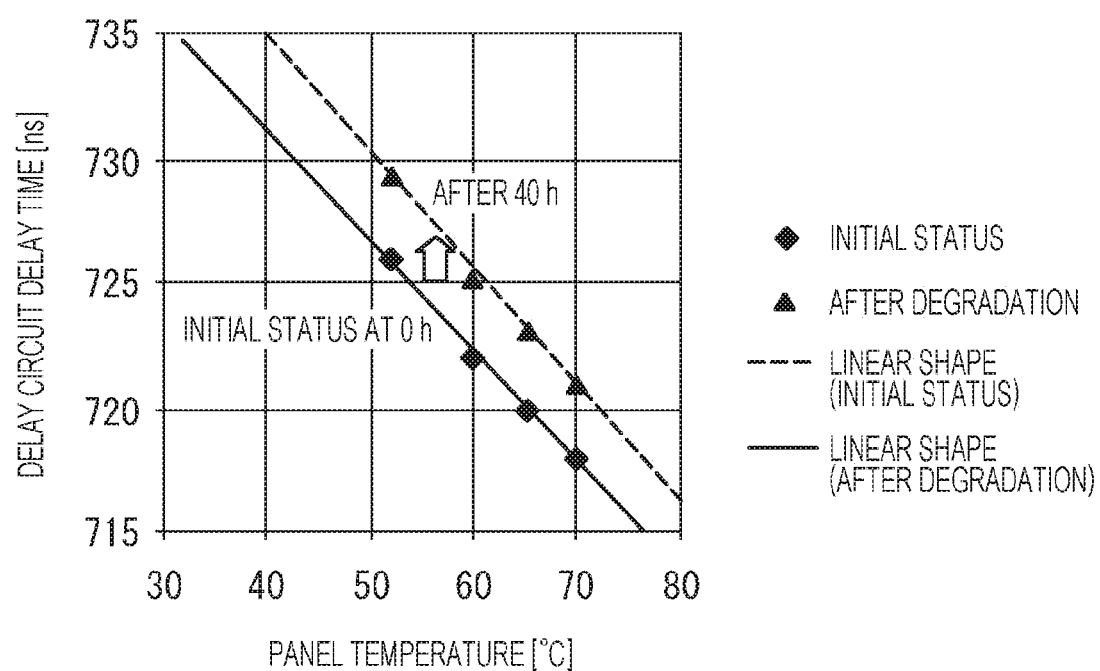
FIG. 9B is a diagram illustrating a relationship between the panel temperature and the delay time of the delay circuit.

FIG. 9A illustrates waveforms of the input pulse IN of the delay circuit 70 and the output pulse OUT of the delay circuit 70. The time difference between the rise of the input pulse IN and the rise of the output pulse OUT is given as the whole delay amount (delay time). Furthermore, FIG. 9B illustrates a relationship between the panel temperature and the delay time of the delay circuit 70 (temperature-dependent characteristics). The numerical values illustrated in FIG. 9B are examples, and the numerical values are not limited to these examples. Here, a case where the delay circuit 70 has 50 stages of the inverters is exemplified. It has been confirmed that the delay time is changed by continuously operating the present delay circuit 70, and the delay time is stabilized in about 40 hours (h) with the degradation of the transistor characteristics. In the linear characteristics (temperature-dependent characteristics) in FIG. 9B, there is no large change in the slope between the initial status (0 h) and the status after 40 h, and a parallel shift is observed.

Parenthetically, the mechanism of the degradation of transistor characteristics is as follows. That is, for example, hot carriers having high energy accelerated by a drain electric field are implanted into a gate oxide film, and the transistor characteristics fluctuate. A drain-source current $I_{ds}$, a threshold voltage $V_{th}$, and the like can be exemplified as the transistor characteristics.

In the temperature sensor circuit 50 according to the first working example having the above-described configuration, the delay circuit 70 obtained by connecting the plurality of inverters $71_1$ to $71_{2n-1}$ in series is a circuit having a temperature dependence, and thus the temperature of liquid crystal panel 10 (panel temperature) can be measured more precisely in accordance with the delay amount of the delay circuit 70. Furthermore, by selectively turning off the circuit operation of the present delay circuit 70 using the standby function by the action of the input side gate circuit (in this example, the NAND circuit 72), the power consumption of the temperature sensor circuit 50 when not in use can be suppressed, while heat generated by the circuit operation of the present delay circuit 70 can be restrained.

Second Working Example

Figure 10:
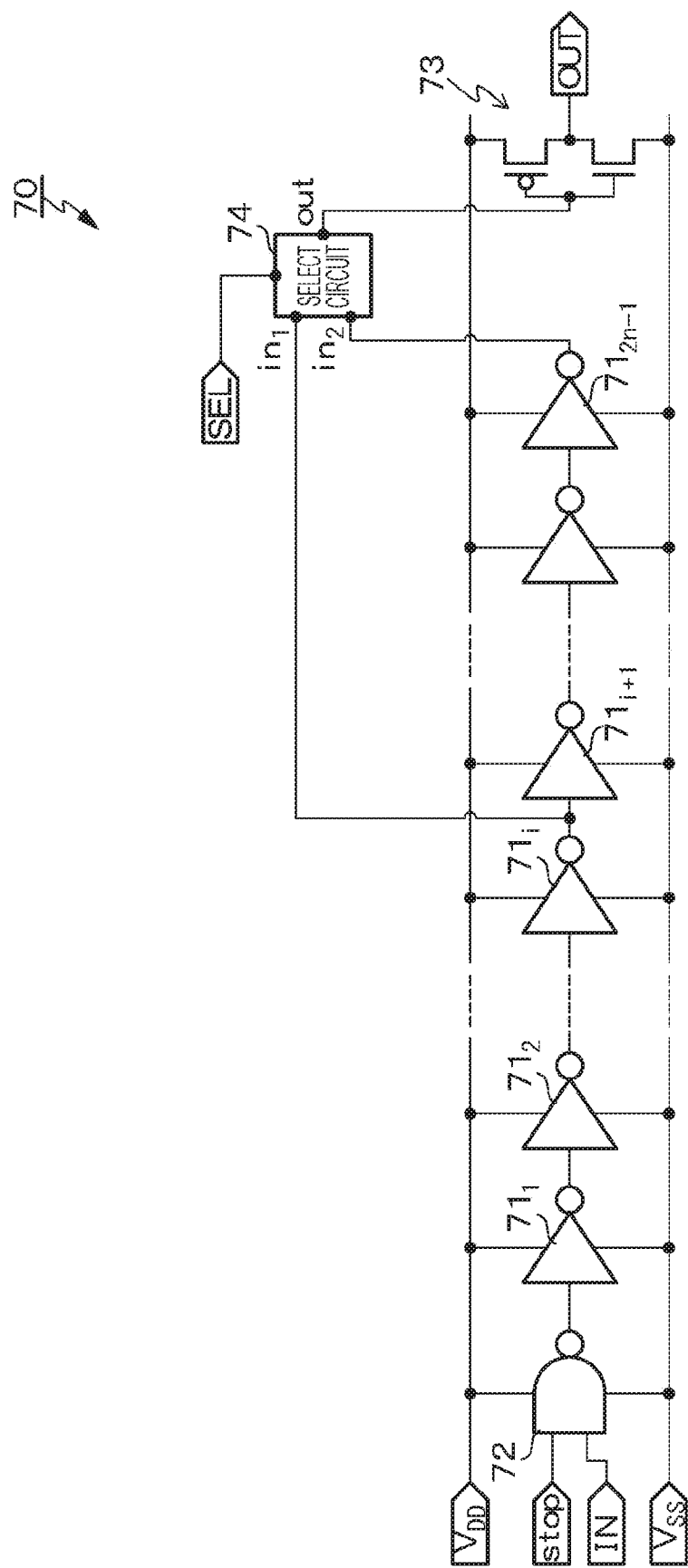
FIG. 10 is a circuit diagram illustrating an example of a circuit configuration of a delay circuit constituting a temperature detection circuit according to a second working example.

A second working example is a modification of the first working example, and is an example in which the delay amount of the temperature sensor circuit 50 made up of a delay circuit is variable. FIG. 10 illustrates an example of a circuit configuration of a delay circuit constituting the temperature sensor circuit 50 according to the first working example.

The delay circuit 70 constituting the temperature sensor circuit 50 according to the second working example has a configuration including a select circuit 74 in addition to the circuit configuration of the first working example. The select circuit 74 treats, for example, the output pulse of the inverter $71_1$ in the i-th stage (i is an arbitrary value) as a first input $in_1$, and the output pulse of the inverter $7_{2n-1}$ in the last stage as a second input $in_2$. Then, the select circuit 74 makes the delay amount of the present delay circuit 70 variable by selecting the input $in_1$ or the second input $in_2$ on the basis of a select signal SEL. Output pulses having different delay amounts are selectively output from an output out of the select circuit 74, and the selected output pulse works as the output pulse OUT of the present delay circuit 70 through the output buffer 73.

In the temperature sensor circuit 50 according to the second working example having the above-described configuration, since the delay amount of the delay circuit 70 is variable, the panel temperature can be measured in accordance with a plurality of delay amounts, and thus the measurement accuracy for the panel temperature can be raised. Note that, here, a configuration that allows to set two types of delay amounts is adopted; however, the configuration is not limited to two types of delay amounts, and a configuration that allows to set three or more types of delay amounts can also be adopted.

Third Working Example

Figure 11A:
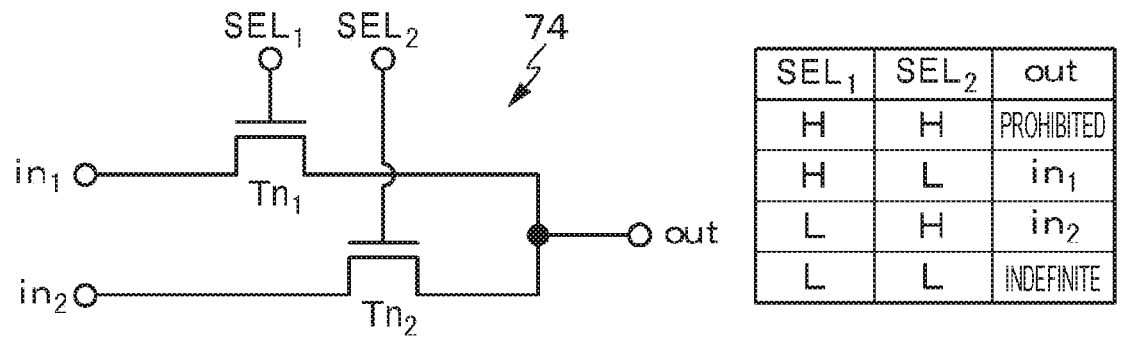
FIGS. 11A-11C are draft circuit diagrams illustrating specific examples of a select circuit according to a third working example.
Figure 11B:
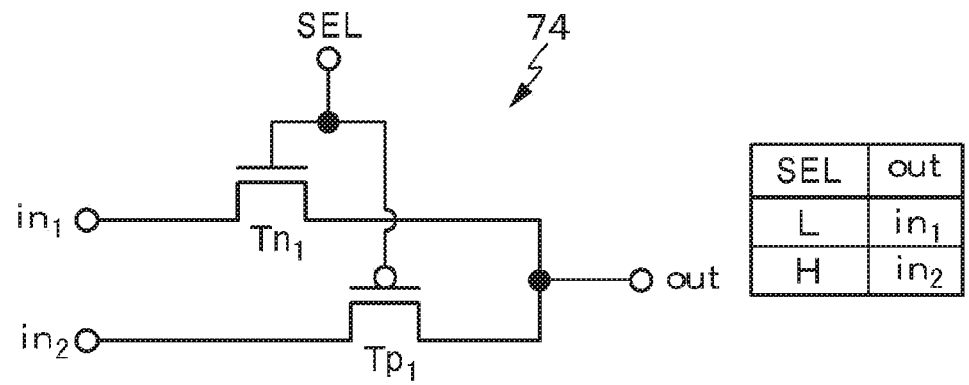
Figure 11C:
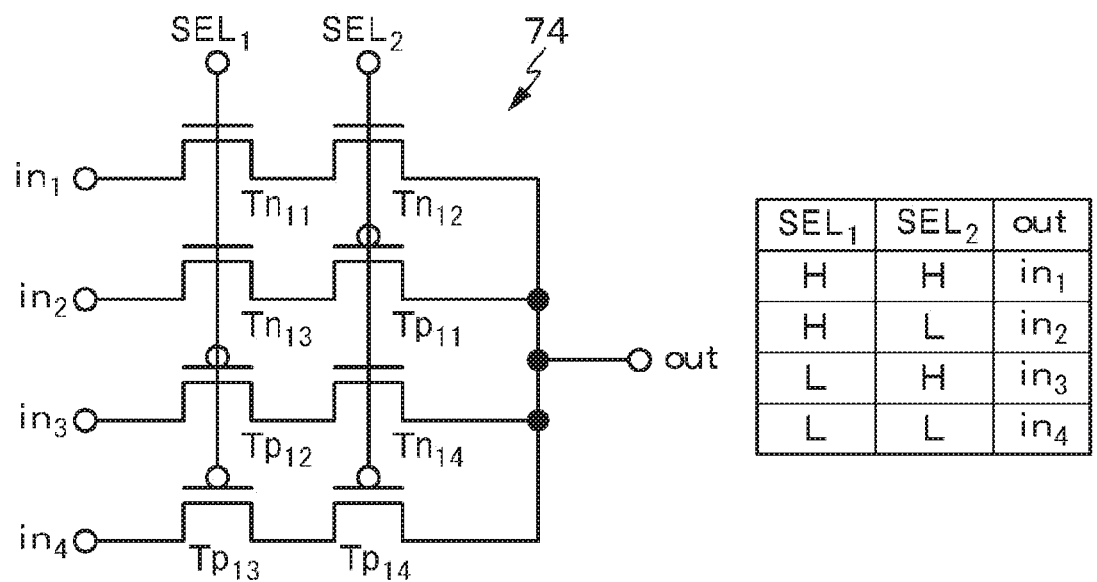

A third working example is an example of specific circuit configurations of the select circuit 74 used in the delay circuit 70 according to the second working example in which the delay amount is variable. FIG. 11 is a circuit diagram illustrating specific examples of the select circuit according to the third working example; FIG. 11A illustrates a first specific example of the select circuit, FIG. 11B illustrates a second specific example of the select circuit, and FIG. 11C illustrates a select circuit of a third specific example.

First Specific Example

The select circuit 74 according to the first specific example is constituted by an N-channel transistor $Tn_1$ connected between a node of the first input $in_1$ and a node of the output out, and an N-channel transistor $Tn_2$ connected between a node of the second input $in_2$ and the node of the output out. Then, a select signal $SEL_1$ and a select signal $SEL_2$ that take two values of a high level (H) and a low level (L) are applied to respective gate electrodes of the transistors $Tn_1$ and $Tn_2$ as the select signal SEL.

In the select circuit 74 according to the first specific example, the input pulse of the first input $in_1$ is selected when the select signal $SEL_1$ has "H" and the select signal $SEL_2$ has "L", and the input pulse of the second input $in_2$ is selected when the select signal $SEL_1$ has "L" and the select signal $SEL_2$ has "H".

Second Specific Example

The select circuit 74 according to the second specific example is constituted by an N-channel transistor $Tn_1$ connected between a node of the first input $in_1$ and a node of the output out, and a P-channel transistor $Tp_1$ connected between a node of the second input $in_2$ and the node of the output out. Then, a select signal SEL that takes two values of a high level and a low level is commonly applied to respective gate electrodes of the transistors $Tn_1$ and $Tp_1$.

In the select circuit 74 according to the second specific example, the input pulse of the first input $in_1$ is selected when the select signal SEL has "H", and the input pulse of the second input $in_2$ is selected when the select signal SEL has "L".

Third Specific Example

The select circuit 74 according to the third specific example has a configuration having the first input $in_1$, the second input $in_2$, a third input $in_3$, and a fourth input $in_4$ in which the output pulse of an inverter at an arbitrary stage in FIG. 10 works as input.

Then, an N-channel transistor $Tn_{11}$ and an N-channel transistor $Tn_{12}$ are connected in series between a node of the first input $in_1$ and a node of the output out, and an N-channel transistor $Tn_1$ and a P-channel transistor $Tp_{11}$ are connected in series between a node of the second input $in_2$ and a node of the output out. Moreover, a P-channel transistor $Tp_{12}$ and an N-channel transistor $Tn_{14}$ are connected in series between a node of the third input $in_3$ and a node of the output out, and a P-channel transistor $Tp_{13}$ and a P-channel transistor $Tp_{14}$ are connected in series between a node of the fourth input $in_{34}$ and a node of the output out.

A select signal $SEL_1$ that takes two values of a high level and a low level is commonly applied to respective gate electrodes of the N-channel transistors $Tn_{11}$ and $Tn_{13}$, and the P-channel transistors $Tp_{12}$ and $Tp_{13}$. Furthermore, a select signal $SEL_2$ that takes two values of a high level and a low level is commonly applied to respective gate electrodes of the N-channel transistor $Tn_{12}$, the P-channel transistor $Tp_{11}$, the N-channel transistor $Tn_4$, and the P-channel transistor $Tp_{14}$.

In the select circuit 74 according to the third specific example, the input pulse of the first input $in_1$ is selected when both of the select signals $SEL_1$ and $SEL_2$ have "H", and the input pulse of the second input $in_2$ is selected when the select signal $SEL_1$ has "H" and the select signal $SEL_2$ has "L". Furthermore, the input pulse of the third input $in_3$ is selected when the select signal $SEL_1$ has "L" and the select signal $SEL_2$ has "H", and the input pulse of the fourth input $in_4$ is selected when both of the select signals $SEL_1$ and $SEL_2$ have "L".

Note that the above-described circuit configurations of the select circuit 74 according to the first to third specific examples are examples, and are not limited to these circuit configurations in which two types and four types of delay amounts can be selected; the circuit configuration does not matter as long as three types and five or more types of delay amounts can be selected.

Fourth Working Example

Figure 12:
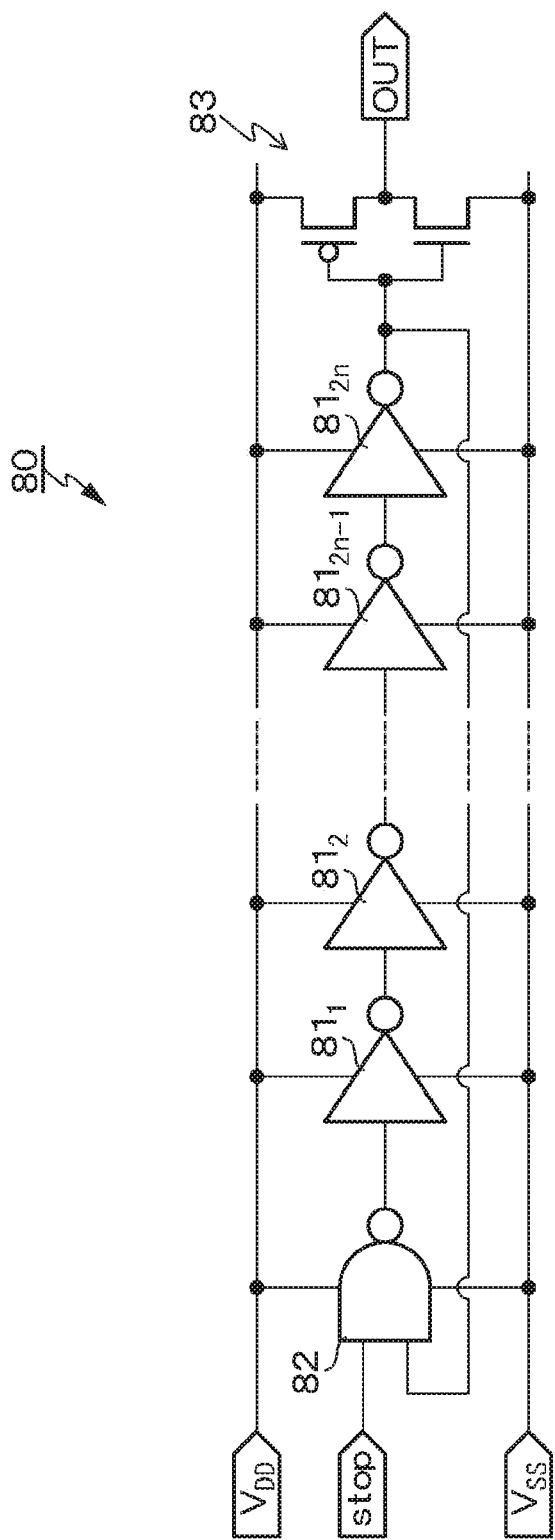
FIG. 12 is a circuit diagram illustrating an example of a circuit configuration of a ring oscillator constituting a temperature sensor circuit according to a fourth working example.

A fourth working example is an example in which a circuit having a temperature dependence of the temperature sensor circuit 50 is made up of a ring oscillator. FIG. 12 illustrates an example of a circuit configuration of a ring oscillator constituting the temperature sensor circuit 50 according to the fourth working example.

A ring oscillator 80 according to the fourth working example has a configuration made up of a total of inverters in odd-numbered 2n+1 stages, where a plurality of inverters $81_1$ to $81_{2n}$ is connected in series between a high-potential-side power supply $V_{DD}$ and a low-potential-side power supply $V_{SS}$, and a two-input NAND circuit 82 is provided as an example of a gate circuit on an input side of the inverter $81_1$ in the first stage. Furthermore, an output buffer 83 made up of a CMOS inverter is provided on an output side of the inverter $81_{2n}$ in the last stage.

A standby control signal stop is input as one input signal for the NAND circuit 82 in the input stage. As the standby control signal stop, a signal that becomes a high level (for example, a $V_{DD}$ level) when the present ring oscillator 80 as the temperature sensor circuit 50 measures the temperature of the liquid crystal panel 10, and becomes a low level (for example, a $V_{SS}$ level) when the measurement is not performed can be exemplified. Furthermore, another end of the NAND circuit 82 accepts input of the output pulse of the inverter $81_{2n}$ in the last stage to constitute a ring oscillator. In a case where the control function using the standby control signal stop is unnecessary, the NAND circuit 82 can be replaced with an inverter. In addition, the output buffer 83 is disposed in the case of necessity to adjust the number of stages and size of inverters according to a load to be driven.

The NAND circuit 82 in the input stage has a standby function of turning on and off the circuit operation of the present ring oscillator 80 by treating the standby control signal stop as the one input signal stop. By having the standby function, the ring oscillator 80 can suppress power consumption when not in use and restrain heat generation due to the circuit operation of the ring oscillator 80. Since the temperature sensor circuit 50 also generates heat, it is preferred to measure the temperature after a predetermined time has elapsed after the operation is turned on.

Figure 13A:
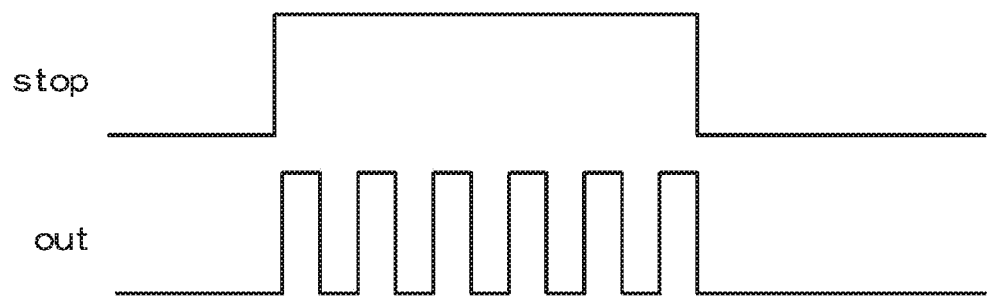
FIG. 13A is a waveform diagram illustrating a standby control signal stop of the ring oscillator and an output pulse OUT of the ring oscillator.

FIG. 13A illustrates the waveforms of the standby control signal stop of the ring oscillator 80 and the output pulse OUT of the ring oscillator 80. Assuming that the average delay time per inverter as a delay circuit is $t_d$, an oscillation cycle T of the ring oscillator 80 made up of inverters in the 2n+1 stages is given as $$T = t_d \times (2n+1) \times 2,$$

and an output frequency (oscillation frequency) f of the ring oscillator 80 is given as $$f = 1/T.$$

Figure 13B:
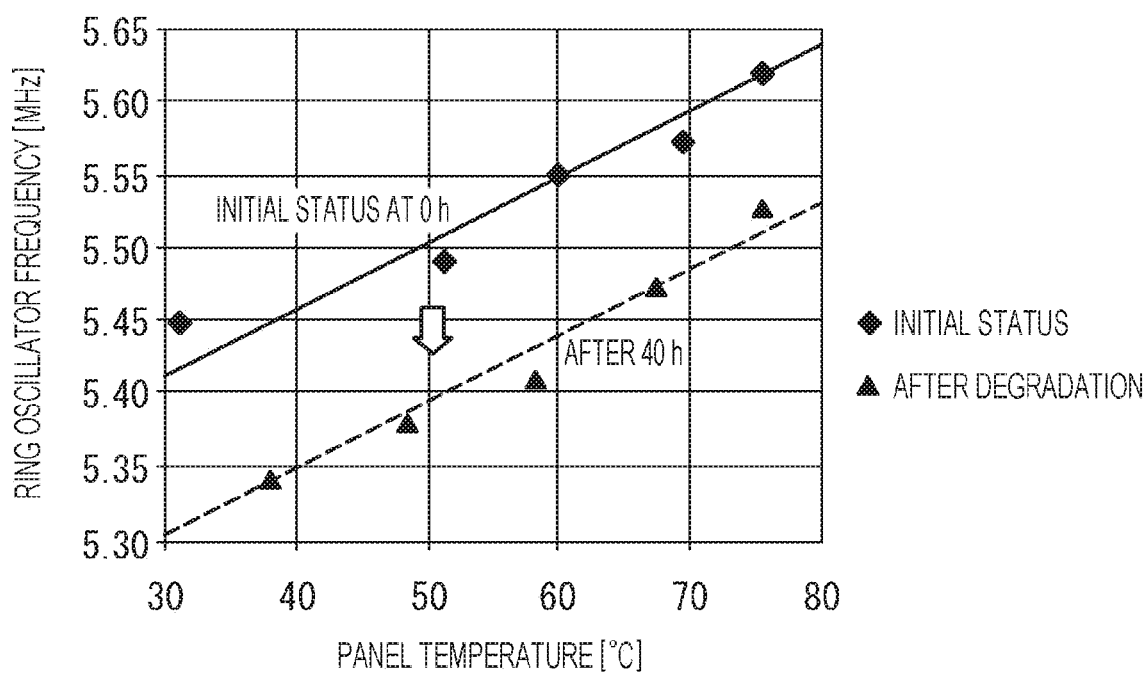
FIG. 13B is a diagram illustrating a relationship between the panel temperature and the oscillation frequency of the ring oscillator.

FIG. 13B illustrates a relationship between the panel temperature and the output frequency of the ring oscillator 80 (temperature-dependent characteristics). The numerical values illustrated in FIG. 13B are examples, and the numerical values are not limited to these examples. Here, a case where the ring oscillator 80 has 13 stages of the inverters is exemplified. It has been confirmed that the oscillation frequency is changed by continuously operating the present ring oscillator 80, and the oscillation frequency is stabilized in about 40 hours (h) with the degradation of the transistor characteristics. In the linear characteristics (temperature-dependent characteristics) in FIG. 13B, there is no large change in the slope between the initial status (0 h) and the status after 40 h, and a parallel shift is observed. The mechanism of the degradation of transistor characteristics is the same as in the case of the delay circuit 70.

In the temperature sensor circuit 50 according to the fourth working example having the above-described configuration, the ring oscillator 80 obtained by connecting the plurality of inverters 81$_1$ to 81$_{2n}$ in series is a circuit having a temperature dependence, and thus the panel temperature can be measured more precisely in accordance with the output frequency of the ring oscillator 80. Furthermore, by selectively turning off the circuit operation of the present ring oscillator 80 using the standby function by the action of the input side gate circuit (in this example, the NAND circuit 82), the power consumption of the temperature sensor circuit 50 when not in use can be suppressed, while heat generated by the circuit operation of the present ring oscillator 80 can be restrained.

Fifth Working Example

Figure 14:
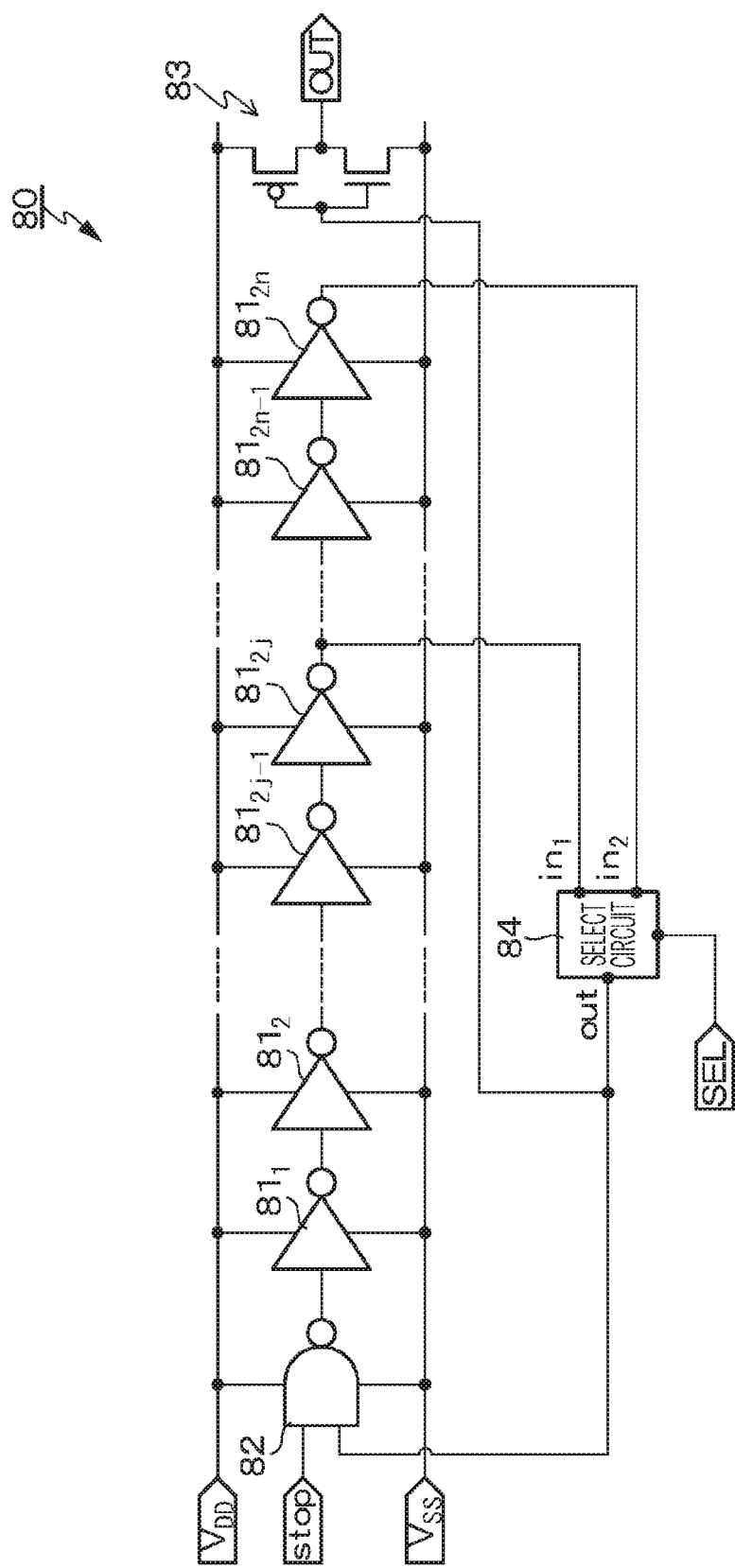
FIG. 14 is a circuit diagram illustrating an example of a circuit configuration of a ring oscillator constituting a temperature sensor circuit according to a fifth working example.

A fifth working example is a modification of the fourth working example, and is an example in which the output frequency of the temperature sensor circuit 50 made up of a ring oscillator is variable. FIG. 14 illustrates an example of a circuit configuration of a ring oscillator constituting the temperature sensor circuit 50 according to the fifth working example.

The ring oscillator 80 constituting the temperature sensor circuit 50 according to the fifth working example has a configuration including a select circuit 84 in addition to the circuit configuration of the fourth working example. The select circuit 84 treats, for example, the output pulse of the inverter 81$_{2j}$ in the 2j-th stage (2j is an arbitrary value) as a first input in$_1$, and the output pulse of the inverter 81$_{2n}$ in the last stage as a second input in$_2$. Then, the select circuit 84 makes the output frequency of the present ring oscillator 80 variable by selecting the first input in$_1$ or the second input in$_2$ on the basis of a select signal SEL. Output pulses having different frequencies are selectively output from an output out of the select circuit 74, and the selected output pulse works as the output pulse OUT of the present ring oscillator 80 through the output buffer 83.

As the select circuit 84 of the ring oscillator 80 according to the fifth working example, similarly to the case of the delay circuit 70 according to the second working example in which the delay amount is variable, the select circuit according to the first example illustrated in FIG. 11A, the select circuit according to the second example in FIG. 11B, or the select circuit according to the third example in FIG. 11C can be used.

In the temperature sensor circuit 50 made up of the ring oscillator 80 according to the fifth working example having the above-described configuration, since the output frequency of the ring oscillator 80 is variable, the panel temperature can be measured in accordance with a plurality of output frequencies, and thus the measurement accuracy for the panel temperature can be raised. Furthermore, in order to reduce the radiation, it is possible to make adjustments such as setting an output frequency that restrains resonance with the length of a wire that transfers the output pulse OUT. Note that, here, a configuration that allows to set two types of output frequencies is adopted; however, the configuration is not limited to two types of output frequencies, and a configuration that allows to set three or more types of output frequencies can also be adopted.

Sixth Working Example

Figure 15:
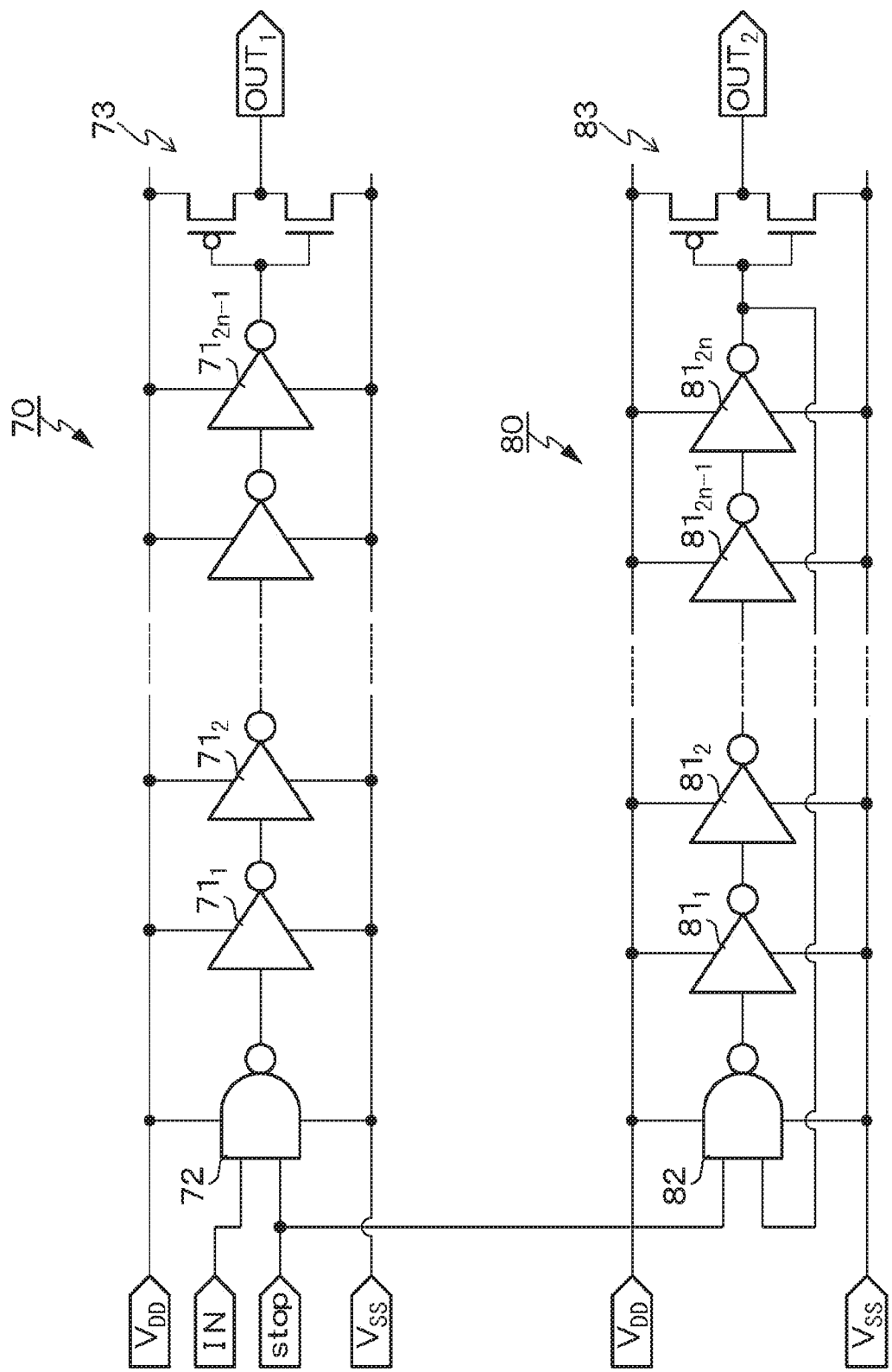
FIG. 15 is a circuit diagram illustrating an example of a circuit configuration of a ring oscillator constituting a temperature sensor circuit according to a sixth working example.

A sixth working example is an example in which a circuit having a temperature dependence of the temperature sensor circuit 50 is made up of a combination of a delay circuit and a ring oscillator. FIG. 15 illustrates an example of a circuit configuration made up of a combination of a delay circuit and a ring oscillator constituting the temperature sensor circuit 50 according to the sixth working example.

The temperature sensor circuit 50 according to the sixth working example has a configuration made up of the delay circuit 70 according to the first working example having the circuit configuration illustrated in FIG. 8 and the ring oscillator 80 according to the fourth working example having the circuit configuration illustrated in FIG. 12. As described above, in the temperature sensor circuit 50 according to the sixth working example in which a circuit having a temperature dependence is made up of a combination of the delay circuit 70 and the ring oscillator 80, the panel temperature can be measured more precisely in accordance with the delay amount of the delay circuit 70 and the output frequency of the ring oscillator 80.

Furthermore, the technology according to the second working example in which the delay amount of the temperature sensor circuit 50 is variable, and the technology according to the fifth working example in which the output frequency of the temperature sensor circuit 50 is variable can be applied also to the temperature sensor circuit 50 according to the sixth working example.

Seventh Working Example

A seventh working example is an example of variations of a circuit configuration of a logic circuit that can be used for the temperature sensor circuit 50 (the delay circuit 70 and the ring oscillator 80). Here, as the logic circuit, an inverter circuit made up of a CMOS logic circuit, a NAND circuit, and a NOR circuit will be exemplified. The temperature sensor circuit 50 (the delay circuit 70 and the ring oscillator 80) can be configured using the inverter circuit, the NAND circuit, and the NOR circuit of the circuit examples described below.

Example of CMOS Logic Circuit

FIG. 16 illustrates a MIL symbol (logic circuit symbol), a truth table, and a circuit example of the inverter circuit according to the seventh working example. The inverter circuit has a CMOS inverter configuration made up of a P-channel MOS transistor $Tp_{21}$ and an N-channel MOS transistor $Tn_{21}$ connected in series between a high-potential-side power supply $V_{DD}$ and a low-potential-side power supply (for example, GND), in which respective gate electrodes of the two transistors and respective source electrodes of the two transistors are commonly connected. Then, a common gate connection node works as an input end IN, and a common drain connection node works as an output end OUT.

FIG. 17 illustrates a MIL symbol, a truth table, and a circuit example of the NAND circuit according to the seventh working example. The NAND circuit is made up of two P-channel MOS transistors $Tp_{22}$ and $Tp_{23}$ and two N-channel MOS transistors $Tn_{22}$ and $Tn_{23}$. The two P-channel MOS transistors $Tp_{22}$ and $Tp_{23}$ are connected in parallel, and a common source connection node is connected to the high-potential-side power supply $V_{DD}$. The two N-channel MOS transistors $Tn_{22}$ and $Tn_{23}$ are connected in series between a common drain connection node of the two P-channel MOS transistors $Tp_{22}$ and $Tp_{23}$ and the low-potential-side power supply (for example, GND).

Then, respective gate electrodes of the P-channel MOS transistor $Tp_{22}$ and the N-channel MOS transistor $Tn_{22}$ are commonly connected to work as a first input end $IN_1$, and respective gate electrodes of the P-channel MOS transistor $Tp_{23}$ and the N-channel MOS transistor $Tn_{23}$ are commonly connected to work as a second input end $IN_2$. Furthermore, respective common drain connection nodes of the P-channel MOS transistors $Tp_{22}$ and $Tp_{23}$ and the N-channel MOS transistor $Tn_{22}$ work as an output end OUT.

FIG. 18 illustrates a MIL symbol, a truth table, and a circuit example of the NOR circuit according to the seventh working example. The NOR circuit is made up of two P-channel MOS transistors $Tp_{24}$ and $Tp_{25}$ and two N-channel MOS transistors $Tn_{24}$ and $Tn_{25}$. The two P-channel MOS transistors $Tp_{24}$ and $Tp_{25}$ are connected in series, and a source electrode of the MOS transistor $Tp_{25}$ as one of the two P-channel MOS transistors is connected to the high-potential-side power supply $V_{DD}$. In the two N-channel MOS transistors $Tn_{24}$ and $Tn_{25}$, respective drain electrodes are connected to a drain electrode of the P-channel MOS transistors $Tp_{24}$, and respective source electrodes are connected to the low-potential-side power supply (for example, GND).

Then, respective gate electrodes of the P-channel MOS transistor $Tp_{24}$ and the N-channel MOS transistor $Tn_{24}$ are commonly connected to work as a first input end $IN_1$, and respective gate electrodes of the P-channel MOS transistor $Tp_{25}$ and the N-channel MOS transistor $Tn_{25}$ are commonly connected to work as a second input end $IN_2$. Furthermore, respective common drain connection nodes of the P-channel MOS transistor $Tp_{24}$ and the N-channel MOS transistors $Tn_{24}$ and $Tn_{25}$ work as an output end OUT.

Example of NMOS Single Logic Circuit

Figure 19:
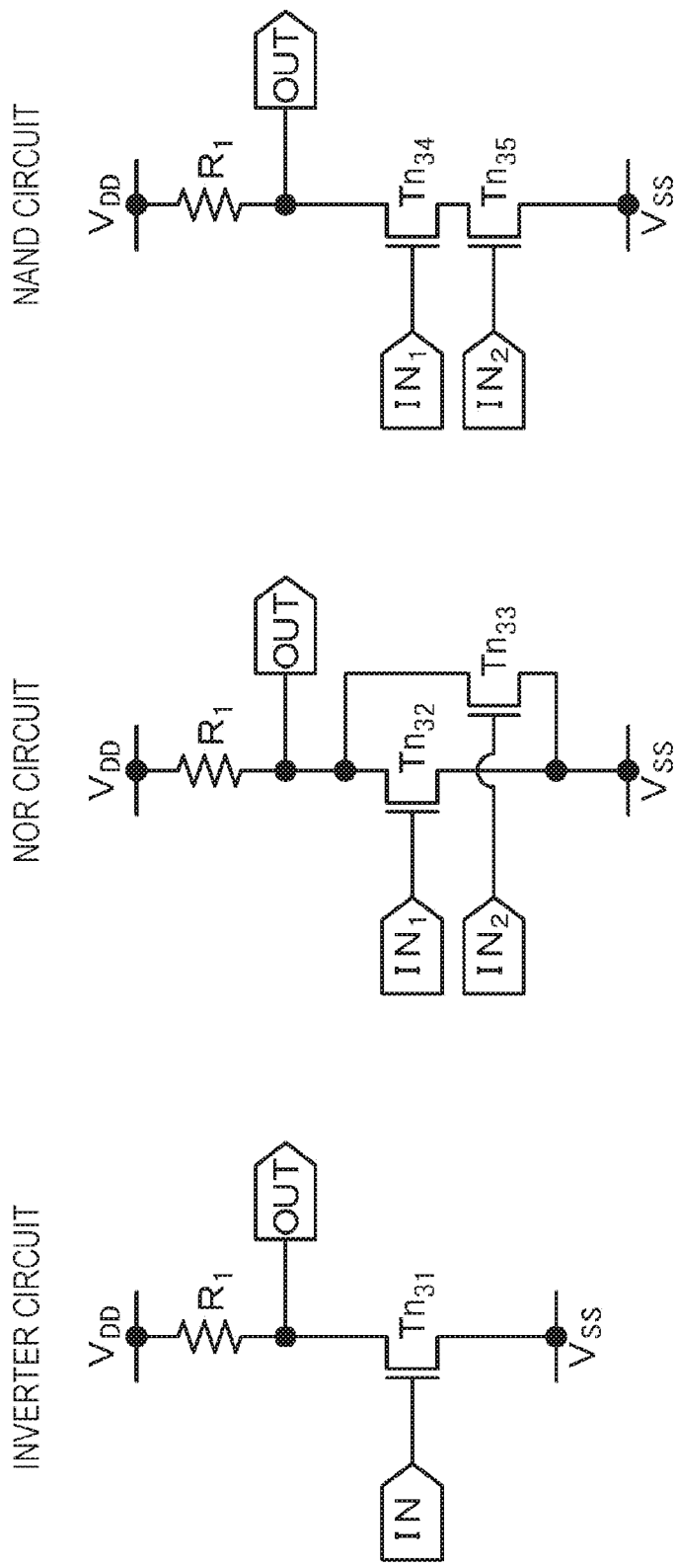
FIG. 19 is a circuit diagram illustrating circuit examples of the inverter circuit, the NOR circuit, and the NAND circuit made up of N-channel metal-oxide-semiconductor (MOS) transistors according to the seventh working example.

FIG. 19 illustrates circuit examples of the inverter circuit, the NOR circuit, and the NAND circuit made up of N-channel MOS transistors according to the seventh working example.

The inverter circuit is made up of a resistance element $R_1$ and an N-channel MOS transistor $Tn_{31}$ connected in series between the high-potential-side power supply $V_{DD}$ and the low-potential-side power supply $V_{SS}$. Then, a gate electrode of the N-channel MOS transistor $Tn_{31}$ works as an input end IN, and a common connection node between a drain electrode of the MOS transistor $Tn_{31}$ and the resistance element $R_1$ works as an output end OUT.

The NOR circuit is made up of a resistance element $R_1$ and an N-channel MOS transistor $Tn_{32}$ connected in series between the high-potential-side power supply $V_{DD}$ and the low-potential-side power supply $V_{SS}$, and an N-channel MOS transistor $Tn_{33}$ connected in parallel to the N-channel MOS transistor $Tn_{32}$. Then, a gate electrode of the N-channel MOS transistor $Tn_{32}$ works as a first input end $IN_1$, and a gate electrode of the N-channel MOS transistor $Tn_{33}$ works as a second input end $IN_2$. Furthermore, a common connection node between respective drain electrodes of the MOS transistors $Tn_{32}$ and $Tn_{33}$ and the resistance element $R_1$ works as an output end OUT.

The NAND circuit is made up of a resistance element $R_1$, an N-channel MOS transistor $Tn_{34}$, and an N-channel MOS transistor $Tn_{35}$ connected in series between the high-potential-side power supply $V_{DD}$ and the low-potential-side power supply $V_{SS}$. Then, a gate electrode of the N-channel MOS transistor $Tn_{34}$ works as a first input end $IN_1$, and a gate electrode of the N-channel MOS transistor $Tn_{35}$ works as a second input end $IN_2$. Furthermore, a common connection node between a drain electrode of the MOS transistor $Tn_{34}$ and the resistance element $R_1$ works as an output end OUT.

Example of PMOS Single Logic Circuit

Figure 20:
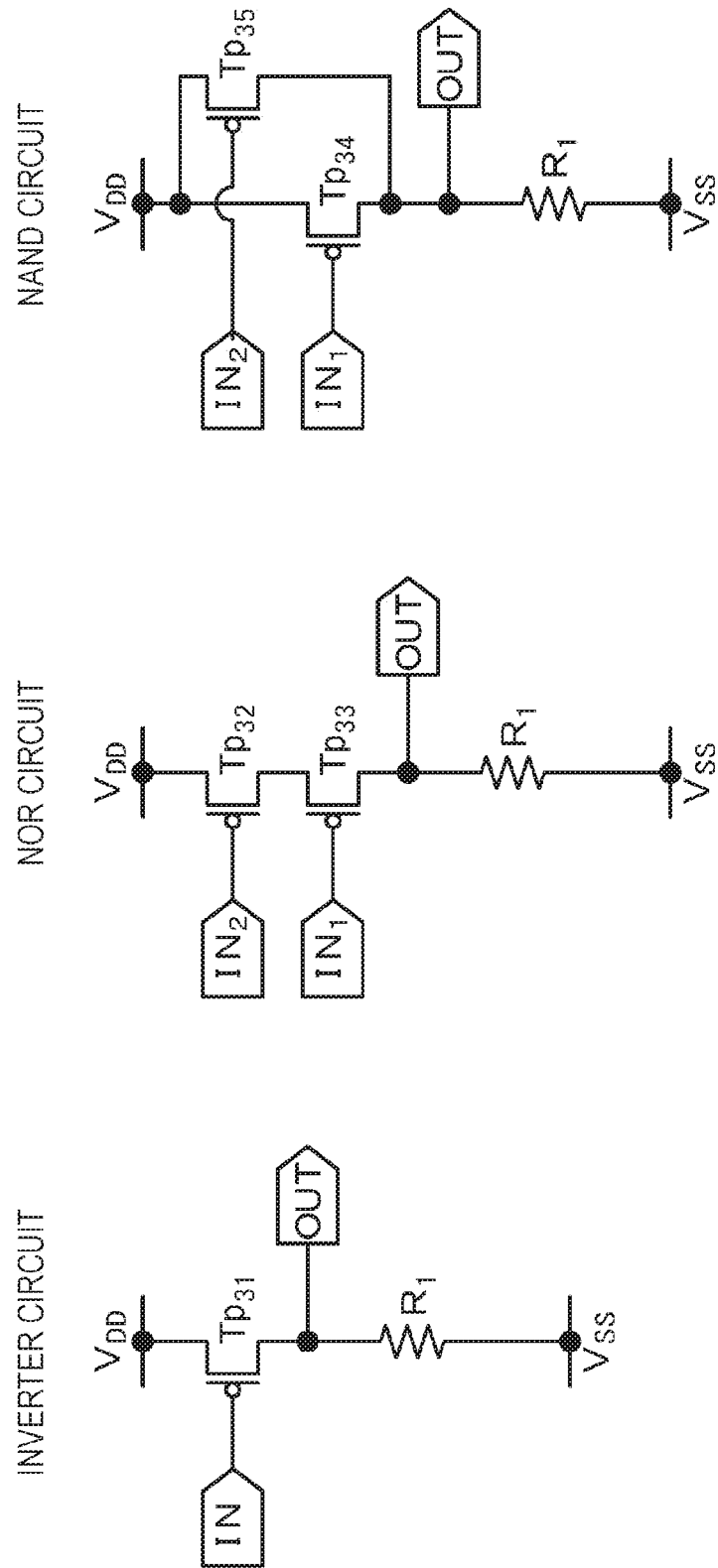
FIG. 20 is a circuit diagram illustrating circuit examples of the inverter circuit, the NOR circuit, and the NAND circuit made up of P-channel MOS transistors according to the seventh working example.

FIG. 20 illustrates circuit examples of the inverter circuit, the NOR circuit, and the NAND circuit made up of P-channel MOS transistors according to the seventh working example.

The inverter circuit is made up of a P-channel MOS transistor $Tp_{31}$ and a resistance element $R_1$ connected in series between the high-potential-side power supply $V_{DD}$ and the low-potential-side power supply $V_{SS}$. Then, a gate electrode of the P-channel MOS transistor $Tp_{31}$ works as an input end IN, and a common connection node between a drain electrode of the MOS transistor $Tp_{31}$ and the resistance element $R_1$ works as an output end OUT.

The NOR circuit is made up of a P-channel MOS transistor $Tp_{32}$, a P-channel MOS transistor $Tp_{33}$, and a resistance element $R_1$ connected in series between the high-potential-side power supply $V_{DD}$ and the low-potential-side power supply $V_{SS}$. Then, a gate electrode of the P-channel MOS transistor $Tp_{32}$ works as a first input end $IN_1$, and a gate electrode of the P-channel MOS transistor $Tp_{33}$ works as a second input end $IN_2$. Furthermore, a common connection node between a drain electrode of the MOS transistor $Tp_{33}$ and the resistance element $R_1$ works as an output end OUT.

The NAND circuit is made up of a P-channel MOS transistor $Tp_{34}$ and a resistance element $R_1$ connected in series between the high-potential-side power supply $V_{DD}$ and the low-potential-side power supply $V_{SS}$, and a P-channel MOS transistor $Tp_{35}$ connected in parallel to the P-channel MOS transistor $Tp_{34}$. Then, a gate electrode of the P-channel MOS transistor $Tp_{34}$ works as a first input end $IN_1$, and a gate electrode of the P-channel MOS transistor $Tp_{35}$ works as a second input end $IN_2$. Furthermore, a common connection node between respective drain electrodes of the MOS transistors $Tp_{34}$ and $Tp_{35}$ and the resistance element $R_1$ works as an output end OUT.

Eighth Working Example

Figure 21A:
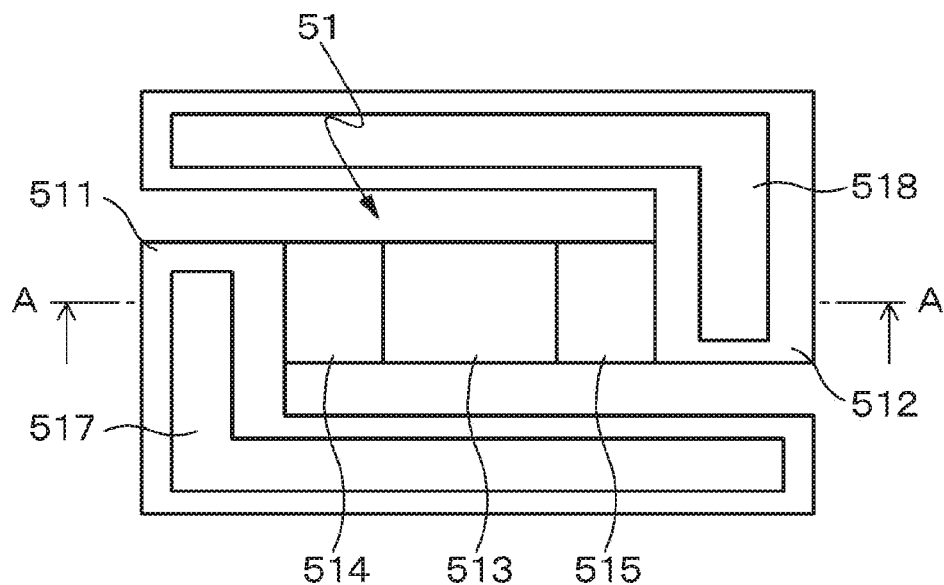
FIG. 21A is a plan view illustrating a transistor structure according to an eighth working example.
Figure 21B:
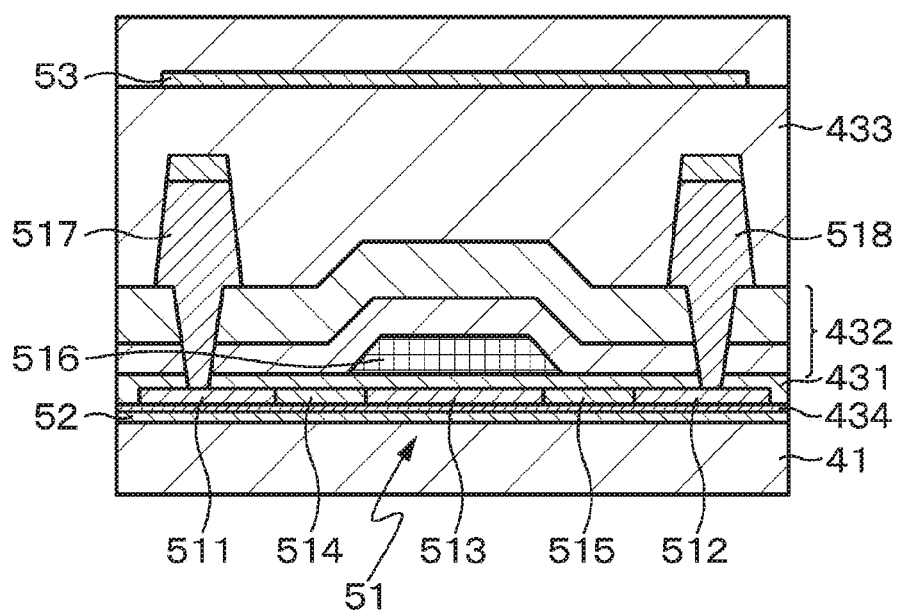
FIG. 21B is a cross-sectional view taken along line A-A in FIG. 21A as viewed in the arrow direction.

An eighth working example is an example of a transistor structure to avoid the influence of a leakage current due to light, that is, for a countermeasure against a leakage current due to light. FIG. 21A illustrates a plan view of a transistor structure according to the eighth working example, and FIG. 21B illustrates a cross-sectional view taken along line A-A in FIG. 21A as viewed in the arrow direction.

When light impinges on a channel portion of the transistor, the leakage current increases and transistor characteristics fluctuate. Since the light intensity is switched according to a mode of a set, such as a low-luminance mode (so-called eco mode) and a high-luminance mode, it is important to block light from impinging on a transistor constituting the temperature sensor circuit 50.

Thus, the transistor structure according to the eighth working example employs a configuration in which a light-shielding structure that shields at least the channel portion from light is provided for a transistor 51 constituting the temperature sensor circuit 50. As illustrated in FIG. 21B, the transistor 51 is formed on the first substrate 41, and includes a source region 511, a drain region 512, and a channel portion 513. Here, an N-channel MOS transistor is demonstrated as an example.

The source region 511 and the drain region 512 are formed by doping phosphorus (P) into a polysilicon film. The channel portion 513 is formed by implanting polon (B) into the polysilicon film. Then, in the N-channel MOS transistor, LDD portions 514 and 515 are formed by implanting phosphorus at a low concentration into the source region 511 and the drain region 512. The LDD portions 514 and 515 induce an action of suppressing hot carriers generated in the transistor portion.

A gate insulating film 431 made up of SiO, SiN, or the like is constructed on top of the source region 511, the LDD portion 514, the channel portion 513, the LDD portion 515, and the drain region 512. A gate electrode 516 is provided facing the channel portion 513 with this gate insulating film 431 interposed between the gate electrode 516 and the channel portion 513, and an insulating film 432 made up of SiN, SiO, or the like is further laminated. A contact electrode 517 electrically linked to the source region 511 and a contact electrode 518 electrically linked to the drain region 512 are provided on the insulating film 432. Then, the entire transistor 51 is covered with an interlayer insulating film 433.

In the transistor structure having the above configuration, a metal layer 52 is provided with an insulating film 434 inserted so as to cover a lower part of the transistor 51 (on the side of the first substrate 41), and furthermore, a metal layer 53 is provided with the interlayer insulating film 433 inserted so as to cover an upper part of the transistor 51 (opposite side to the first substrate 41). These metal layers 52 and 53 form a light-shielding structure that shields the channel portion 513 and the LDD portions 514 and 515 of the transistor 51 from light.

Furthermore, as is clear from FIG. 21A, the contact electrodes 517 and 518 are formed so as to make walls on side surface sides of the transistor 51, specifically, so as to cover the LDD portion 514, the channel portion 513, and the LDD portion 515. These contact electrodes 517 and 518 together with the metal layers 52 and 53 also form a light-shielding structure that shields the channel portion 513 and the LDD portions 514 and 515 of the transistor 51 from light.

As described above, the transistor structure according to the eighth working example has a light-shielding structure that shields the channel portion 513 and the LDD portions 514 and 515 of the transistor 51 from light. By the action of this light-shielding structure, light can be blocked from impinging on the transistor 51 constituting the temperature sensor circuit 50, particularly, the channel portion 513 and the LDD portions 514 and 515. As a result, the transistor characteristics are not affected by the leakage current due to light and do not fluctuate, such that the measurement accuracy for the temperature of the liquid crystal panel 10 by the temperature sensor circuit 50 can be raised as compared with a case where the light-shielding structure is not prepared.

Ninth Working Example

Figure 22A:
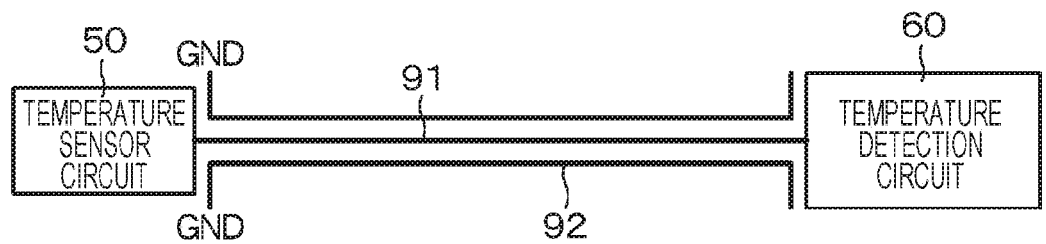
FIGS. 22A-22C are configuration diagrams illustrating specific examples of an electric shield structure according to a ninth working example.
Figure 22B:
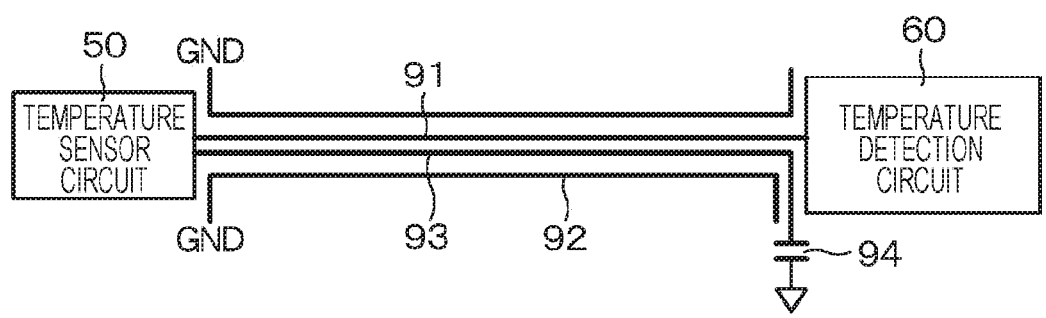
Figure 22C:
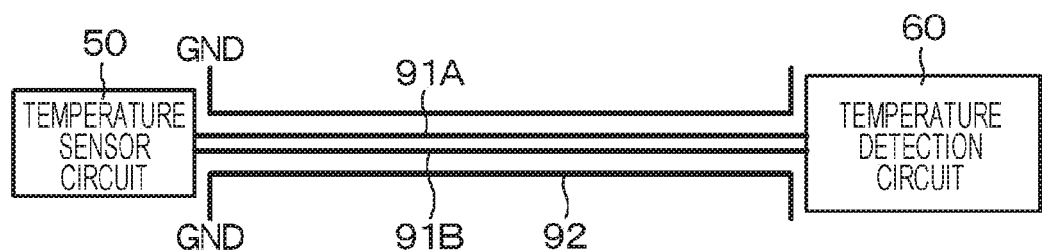

A ninth working example is an example of an electric shield structure for suppressing the influence from the temperature sensor circuit 50 to the periphery. FIG. 22 is a configuration diagram illustrating specific examples of an electric shield structure according to the ninth working example; FIG. 22A illustrates a first specific example of the electric shield structure, FIG. 22B illustrates a second specific example of the electric shield structure, and FIG. 22C illustrates a third specific example of the electric shield structure.

Figure 23:
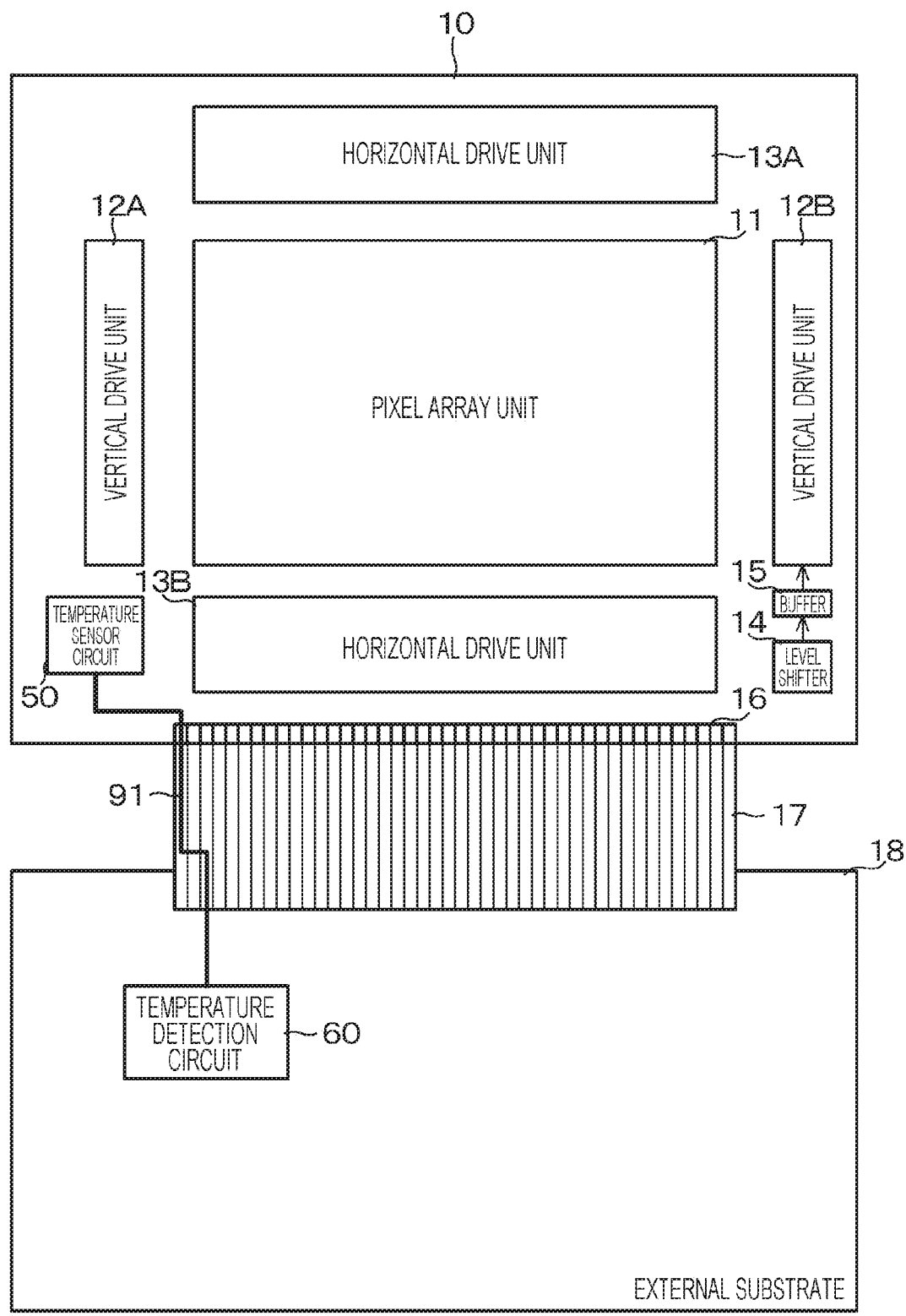
FIG. 23 is an explanatory diagram of an electric connection relationship between a temperature sensor circuit on a liquid crystal panel and a temperature detection circuit outside the panel.

As illustrated in FIG. 23, the temperature detection circuit 60 that detects the temperature of the liquid crystal panel 10 in accordance with the measurement signal of the temperature sensor circuit 50 is provided to be mounted on the external substrate 18 electrically connected to the terminal unit 16 of the liquid crystal panel 10 via the flexible substrate 17. Then, the measurement signal is transferred by an output wire 91 from the temperature sensor circuit 50 in the panel to the temperature detection circuit 60 on the external substrate 18 through the flexible substrate 17.

Here, the temperature sensor circuit 50 made up of the delay circuit 70 and the ring oscillator 80 is driven at a high frequency. Then, a pulse signal is output from the temperature sensor circuit 50 as a measurement signal. For this reason, there is a concern that the output pulse of the temperature sensor circuit 50 may have an influence of jumping or an influence of radiation to an adjacent wire.

First Specific Example

The first specific example is an example in which the temperature detection circuit 60 provided outside the liquid crystal panel 10 is a single-phase input type circuit, and an electric shield structure is configured by setting the potential of a shield wire 92 adjacent to the output wire 91 of the temperature sensor circuit 50 to a fixed potential such as the ground (GND). Specifically, in the planar structure, the potential of shield wires 92 adjacent to the output wire 91 on the left and right are set to a fixed potential, and in the vertical structure, the potential of shield wires 92 adjacent to the output wire 91 in an upper layer and a lower layer are set to a fixed potential. The fixed potential is not limited to the ground potential, but may be a power supply potential or the like.

In the electric shield structure according to the first specific example, by the action of the shield wire 92 set to a fixed potential, the output pulse of the temperature sensor circuit 50 transferred by the output wire 91 can be prevented from exerting the influence of jumping to an adjacent wire, and therefore, the influence from the temperature sensor circuit 50 to the periphery can be suppressed.

Second Specific Example

The case of the second specific example is also an example in which the temperature detection circuit 60 is a single-phase input type circuit. In the second specific example, an auxiliary wire 93 is provided in parallel and adjacent to the output wire 91 of the temperature sensor circuit 50, where one end of the auxiliary wire 93 is connected to the side of the temperature sensor circuit 50, and a load 94 corresponding to the input load of the temperature detection circuit 60 is connected to another end of the auxiliary wire 93. Then, a pulse signal having a phase reverse to the phase of the output pulse of the temperature sensor circuit 50 is transferred by the auxiliary wire 93, whereby a differential electric shield structure is configured. Furthermore, similarly to the case of the first specific example, a shield wire 92 set to a fixed potential is provided adjacent to the output wire 91 of the temperature sensor circuit 50.

In the electric shield structure according to the second specific example, by the action of the auxiliary wire 93 that is provided adjacent to the output wire 91 of the temperature sensor circuit 50 and transfers a pulse signal having a phase reverse to the phase of the output pulse of the temperature sensor circuit 50, the output pulse of the temperature sensor circuit 50 can be prevented from exerting the influence of radiation to the adjacent wire 92. Furthermore, by the action of the shield wire 92 set to a fixed potential, the output pulse of the temperature sensor circuit 50 transferred by the output wire 91 can be prevented from exerting the influence of jumping to an adjacent wire.

Third Specific Example

The third specific example is an example in which the temperature detection circuit 60 is a differential input type circuit, and two output wire 91A and 91B are wired in parallel between the temperature sensor circuit 50 and the temperature detection circuit 60. Then, the output pulse of the temperature sensor circuit 50 is transferred by one of the output wires 91A and 91B, and a pulse signal having a phase reverse to the phase of the output pulse of the temperature sensor circuit 50 is transferred by the other of the output wires 91B and 91A, whereby a differential electric shield structure is configured. Furthermore, similarly to the case of the first specific example, a shield wire 92 set to a fixed potential is provided adjacent to the output wires 91A and 91B of the temperature sensor circuit 50.

Also in the case of the electric shield structure according to the third specific example, by the action of the output wires 91A and 91B that transfer the output pulse of the temperature sensor circuit 50 and a pulse signal having a reverse phase, the output pulse of the temperature sensor circuit 50 can be prevented from exerting the influence of radiation to an adjacent wire. Furthermore, by the action of the shield wire 92 set to a fixed potential, the output pulse of the temperature sensor circuit 50 transferred by the output wire 91 can be prevented from exerting the influence of jumping to an adjacent wire.

Tenth Working Example

A tenth working example is an example of any-time calibration in which the temperature-dependent characteristics of the temperature sensor circuit 50 are calibrated at any time.

As described earlier, in the temperature sensor circuit 50 configured using the delay circuit and the ring oscillator, it has been found out that the transistor characteristics are changed due to driving, and the linear characteristics of the temperature-dependent characteristics (delay amount/frequency-temperature characteristics) of the temperature sensor circuit 50 shift substantially in parallel with substantially the same slope (see FIGS. 9B and 13B).

Thus, in the tenth working example, on the assumption that the slope of the temperature-dependent characteristics of the temperature sensor circuit 50 has been found out, by grasping a temperature which serves as a reference inside a set housing at the time of use, calibration for the temperature-dependent characteristics of the temperature sensor circuit 50 is performed at one point of the linear characteristics. The slope of the temperature-dependent characteristics of the temperature sensor circuit 50 need to be acquired in advance before shipment.

In the following, as to the any-time calibration at one point of the linear characteristics based on the temperature inside the set housing at the time of use, a case where the temperature sensor circuit 50 is made up of the delay circuit 70 will be described as a first example, and a case where the temperature sensor circuit 50 is made up of the ring oscillator 80 will be described as a second example.

First Example (Case of Delay Circuit)

Figure 24A:
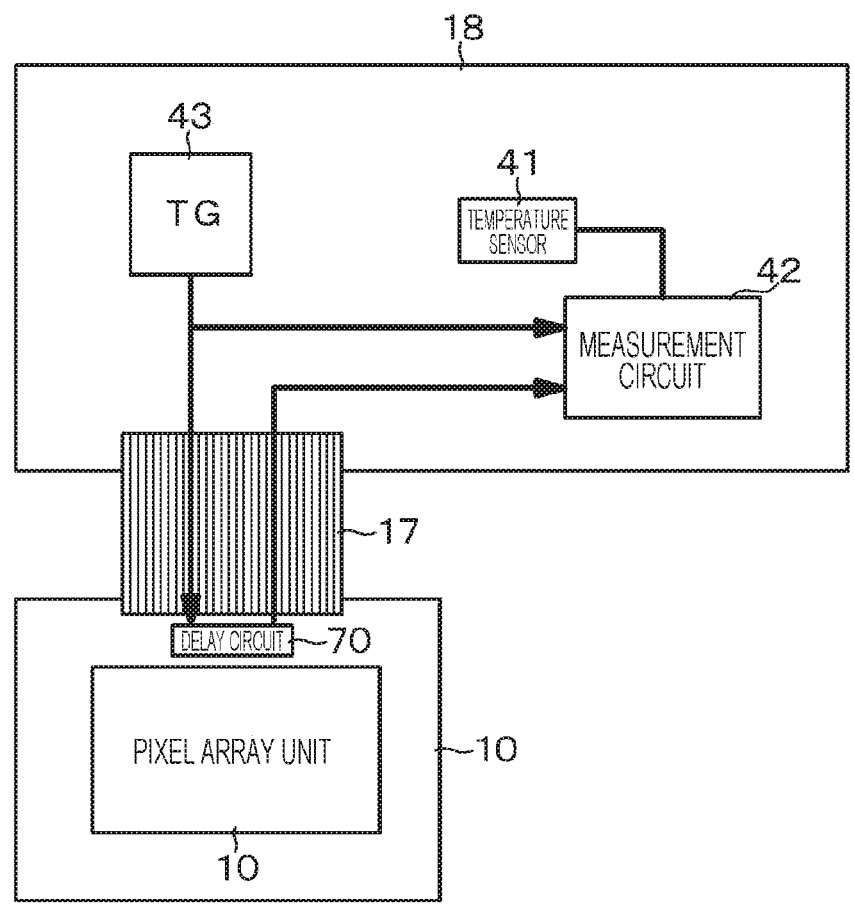
FIG. 24A is a configuration diagram for any-time calibration in a case where the temperature sensor circuit is made up of a delay circuit.
Figure 24B:
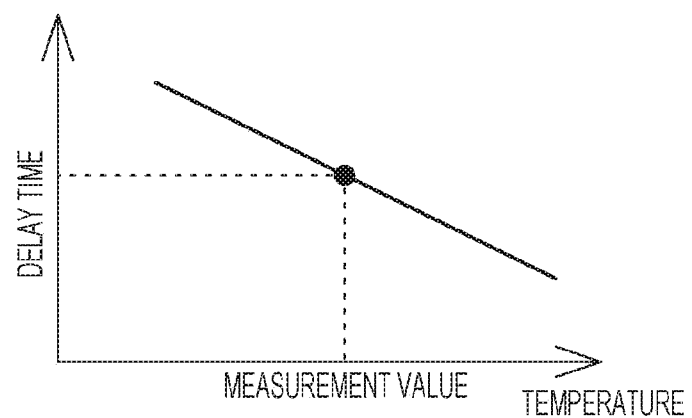
FIG. 24B is an explanatory diagram regarding calibration at one point of delay time-temperature characteristics.

FIG. 24A illustrates a configuration diagram for any-time calibration in a case where the temperature sensor circuit 50 is made up of the delay circuit 70, and FIG. 24B illustrates an explanatory diagram regarding the calibration at one point of delay time-temperature characteristics.

A temperature sensor 41, a measurement circuit 42, and a timing generator (TG) 43 are mounted on the external substrate 18; the temperature sensor 41 is made up of, for example, a thermocouple and the like, and is a reference temperature sensor that detects the temperature on the external substrate 18 as a reference temperature. The detection value of the temperature sensor 41 is supplied to the measurement circuit 42. The timing generator 43 supplies a pulse signal having a predetermined frequency to the measurement circuit 42 and the delay circuit 70 on the liquid crystal panel 10. The delay circuit 70 treats the pulse signal supplied from the timing generator 43 as an input pulse, and supplies an output pulse obtained by delaying this input pulse, to the measurement circuit 42. The measurement circuit 42 compares the pulse signal supplied from the timing generator 43 with the pulse signal supplied from the delay circuit 70, and measures the time difference between the pulse signals as a delay time.

Figure 25:
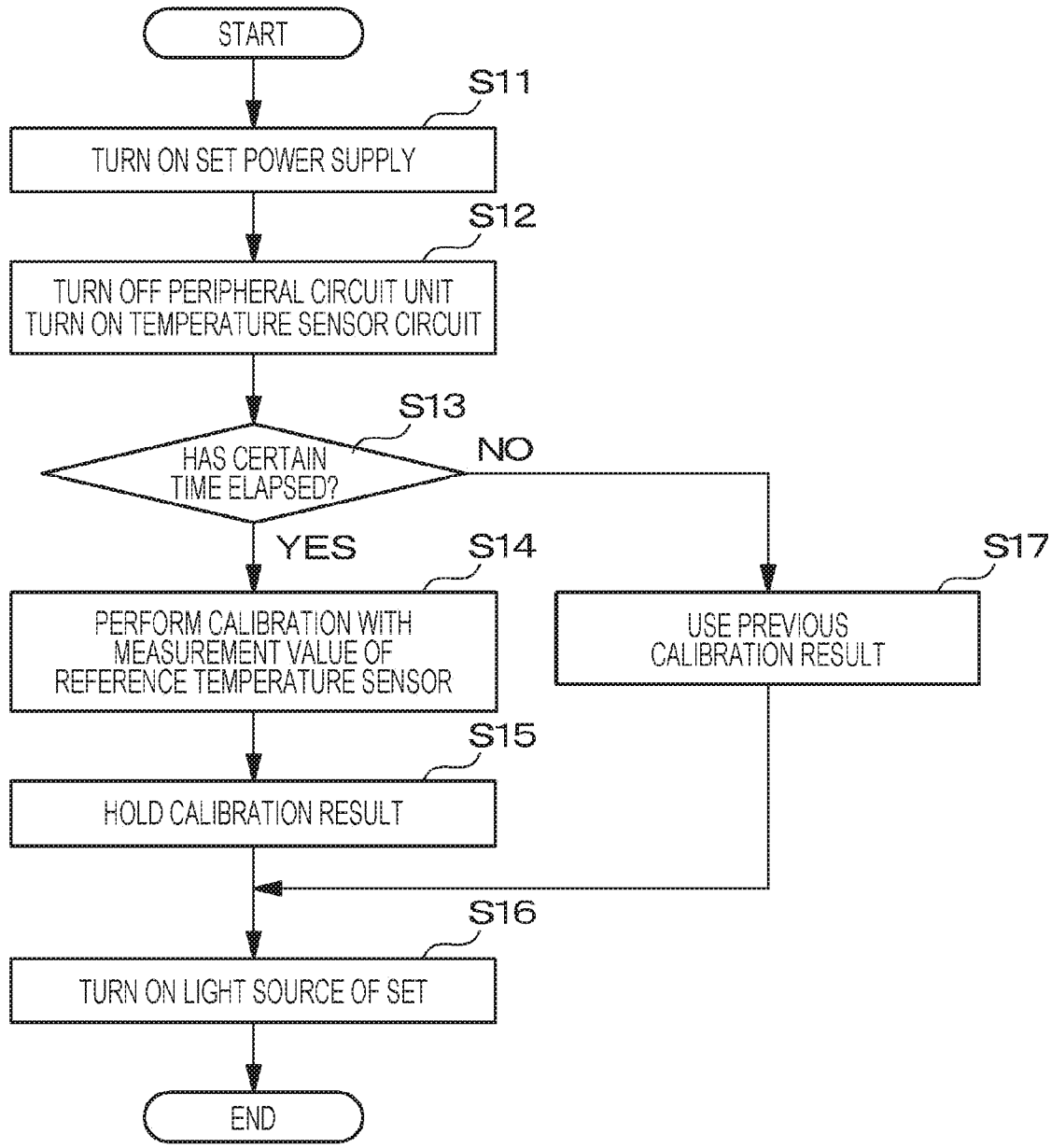
FIG. 25 is a flowchart illustrating an example of an any-time calibration operation according to a tenth working example.

Subsequently, an example of the any-time calibration operation will be described with reference to the flowchart in FIG. 25.

First, set power supply is turned on (step S11); thereafter, the operation of the peripheral circuit unit on the liquid crystal panel 10 is turned off such that heat is not generated, and the temperature sensor circuit 50 is turned on (step S12). Next, it is determined whether or not a certain time (for example, 24 hours) has elapsed since the previous time the set power supply was turned off (step S13). This is determination processing for confirming whether or not the temperature in the set is uniform.

When the certain time has elapsed since the previous time the set power supply was turned off (YES in S13), the temperature-dependent characteristics of the temperature sensor circuit 50 made up of the delay circuit 70, that is, the delay time-temperature characteristics, are calibrated by a measured value of the reference temperature sensor 41 (step S14). Then, the calibration result is held by overwriting (step S15), and thereafter, a light source of the set is turned on (step S16). Consequently, the temperature of the liquid crystal panel 10 rises.

According to this any-time calibration at one point of the linear characteristics, the data of the slope of the temperature-dependent characteristics of the temperature sensor circuit 50 only needs to be acquired in advance before shipment, and a takt time (for example, 40 hours) in which aging by driving is brought about to finish the characteristic degradation before shipment is made unnecessary, which has the advantage of mitigating the burden on production.

Second Example (Case of Ring Oscillator)

Figure 26A:
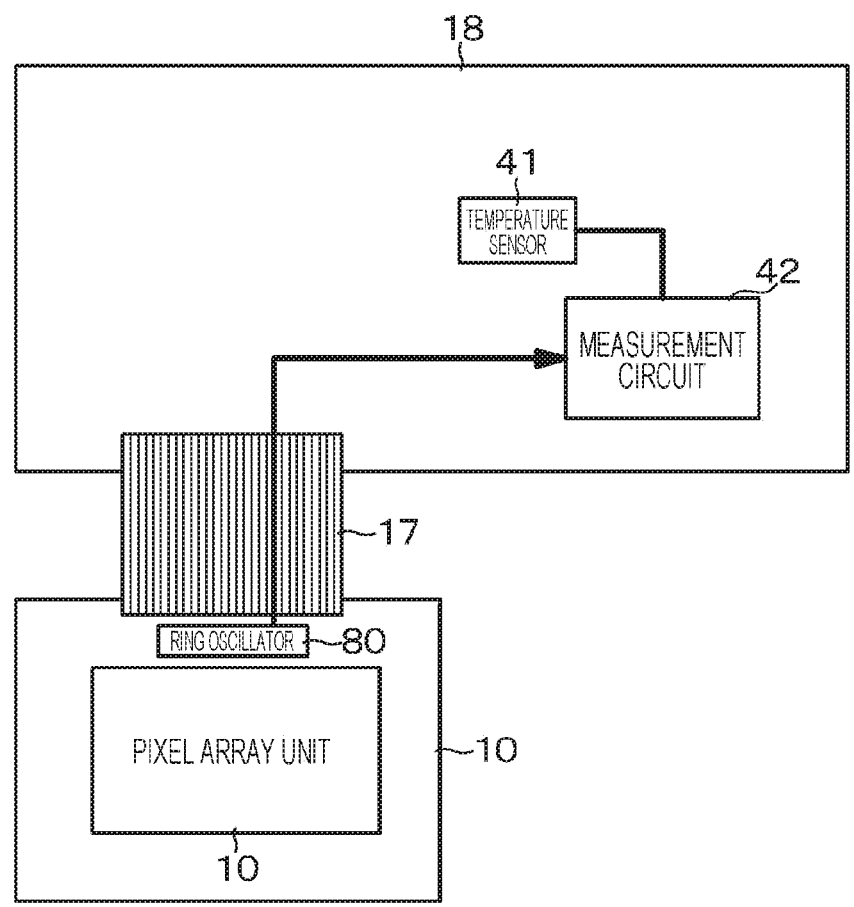
FIG. 26A is a configuration diagram for any-time calibration in a case where the temperature sensor circuit is made up of a ring oscillator.
Figure 26B:
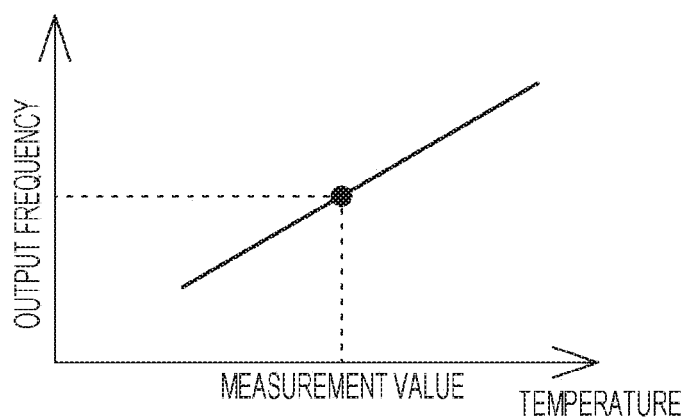
FIG. 26B is an explanatory diagram regarding calibration at one point of output frequency-temperature characteristics.

FIG. 26A illustrates a configuration diagram for any-time calibration in a case where the temperature sensor circuit 50 is made up of the ring oscillator 80, and FIG. 26B is an explanatory diagram regarding calibration at one point of output frequency-temperature characteristics.

In a case where the temperature sensor circuit 50 is made up of the ring oscillator 80, unlike a case where the temperature sensor circuit 50 is made up of the delay circuit 70, the timing generator 43 is unnecessary. Then, the measurement circuit 42 measures the output frequency (oscillation frequency) of the ring oscillator 80 on the basis of a frequency signal supplied from the ring oscillator 80. The operation of the any-time calibration is similar to the case of the delay circuit 70 illustrated in the flowchart in FIG. 25. Furthermore, the action and effect of the any-time calibration at one point are also similar to the case of the delay circuit 70.

Eleventh Working Example

An eleventh working example is an example of any-time calibration at a plurality of points of the linear characteristics at the time of use. In the eleventh working example, calibration is performed at a plurality of points of the temperature dependence linear characteristics of the temperature sensor circuit on the basis of the heat generation state of a heat generation source present near the temperature sensor circuit.

Figure 27:
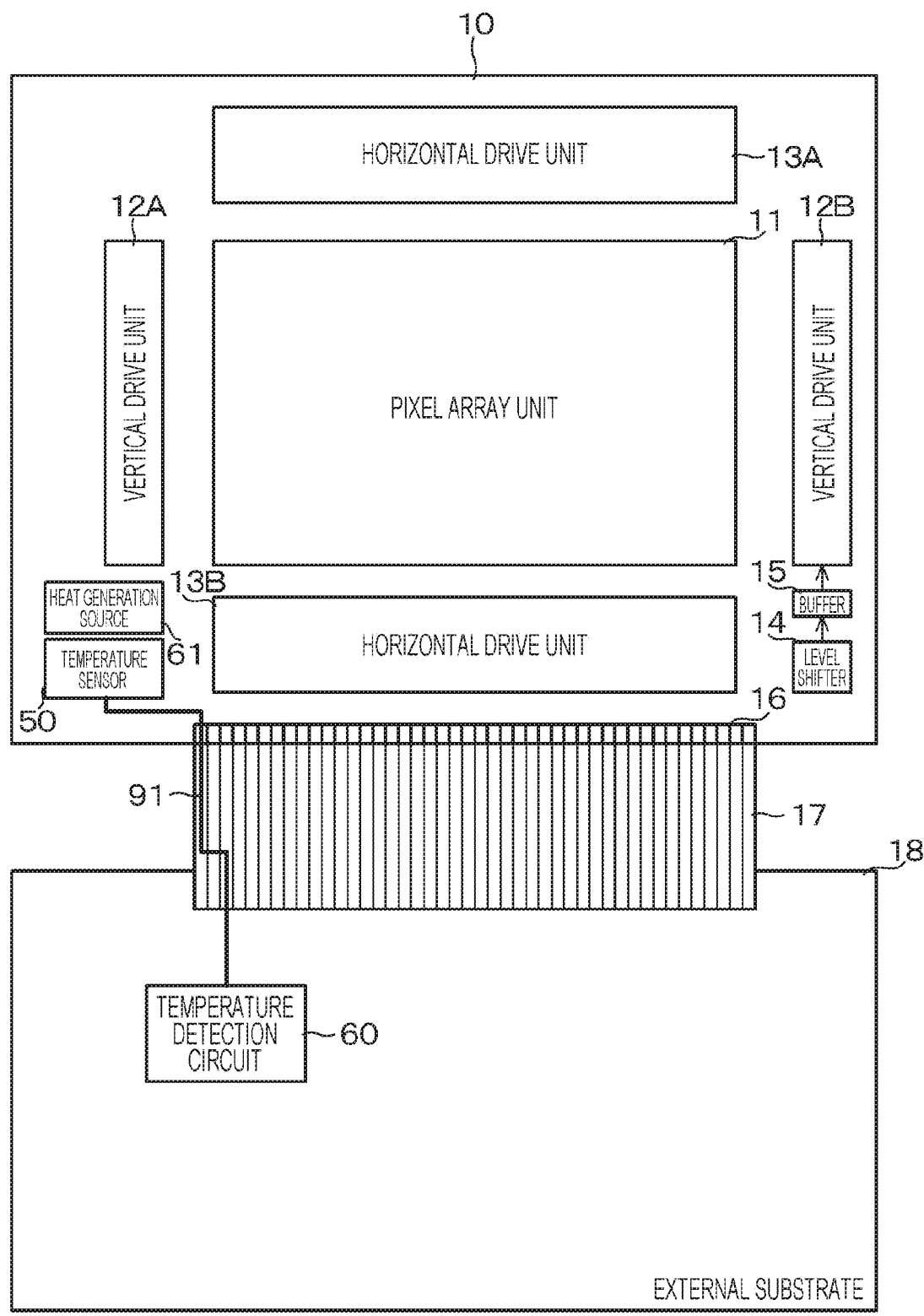
FIG. 27 is a schematic diagram illustrating a system configuration capable of performing any-time calibration at a plurality of points according to an eleventh working example.
Figure 28A:
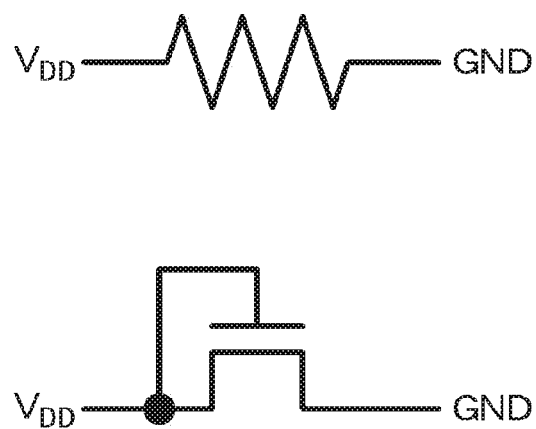
FIG. 28A is a circuit diagram illustrating a specific example of a heat generation source used in the eleventh working example.

FIG. 27 illustrates a system configuration capable of performing the any-time calibration at a plurality of points according to the eleventh working example. As illustrated in FIG. 27, a heat generation source 61 is disposed near, preferably adjacent to, the temperature sensor circuit 50. The heat generation source 61 can be implemented by flowing a current at a high resistance. As an example, as illustrated in FIG. 28A, the heat generation source 61 can be easily implemented by, for example, flowing a current using a high-resistance silicon wire as a resistance element or flowing a current using a transistor having high-resistance diode connection, as a resistance element.

Figure 28B:
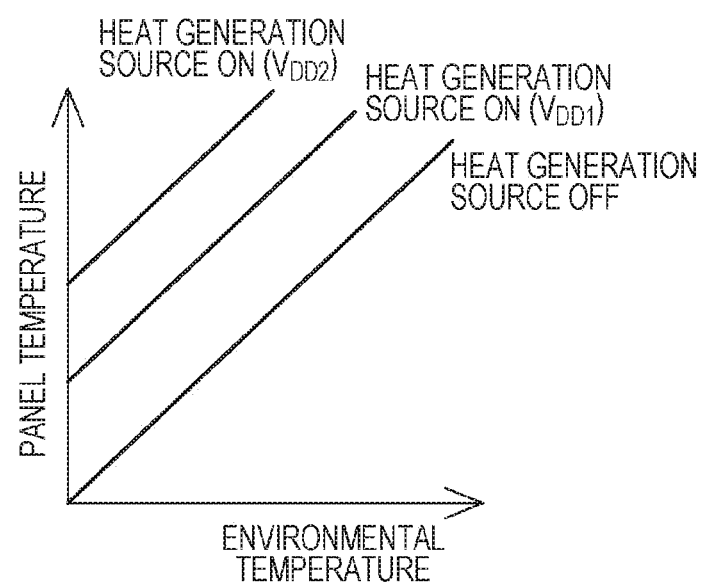
FIG. 28B is a characteristic diagram of the panel temperature with respect to the environmental temperature and a plurality of heat generation states of the heat generation source.

When a power supply voltage $V_{DD}$ of the heat generation source 61 is changed, the amount of current changes, such that the heat generation state of the heat generation source 61 can be altered. Then, the temperature of the liquid crystal panel 10 can be freely adjusted depending on the heat generation state (including the OFF state) of the heat generation source 61. In a case where calibration is triggered at a plurality of points of the linear characteristics at the time of use, as illustrated in FIG. 28B, a plurality of power supply voltages $V_{DD}$ including turning off the heat generation source 61 is set as $V_{DD1}$, $V_{DD2}$, and suchlike.

Figure 29A:
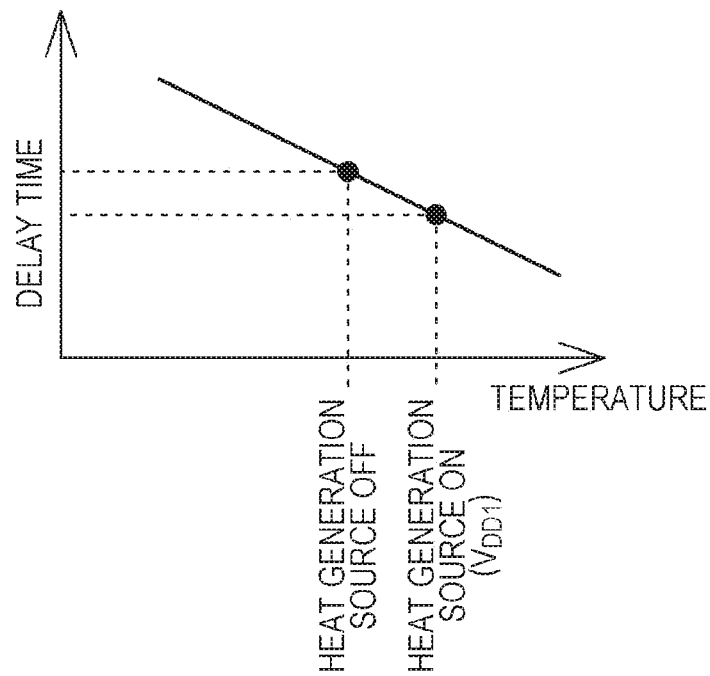
FIG. 29A is an explanatory diagram regarding calibration at a plurality of points of the delay time-temperature characteristics in a case where the temperature sensor circuit is made up of a delay circuit.
Figure 29B:
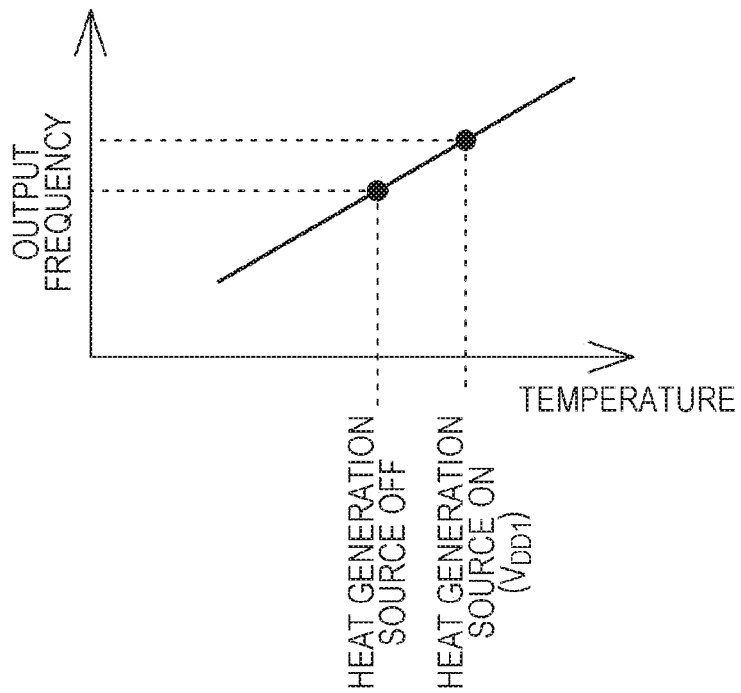
FIG. 29B is an explanatory diagram regarding calibration at a plurality of points of the output frequency-temperature characteristics of a ring oscillator in a case where the temperature sensor circuit is made up of the ring oscillator.

In carrying out the any-time calibration at a plurality of points according to the eleventh working example, it is necessary to acquire the characteristics of the environmental temperature and the panel temperature with respect to the heat generation state of the heat generation source 61 before shipment. The operation of the any-time calibration at a plurality of points is basically similar to the case of the any-time calibration at one point illustrated in the flowchart in FIG. 25. FIG. 29A illustrates calibration at a plurality of points (for example, two points) of the delay time-temperature characteristics in a case where the temperature sensor circuit 50 is made up of the delay circuit 70, and FIG. 29B illustrates calibration at a plurality of points (for example, two points) of the delay time-temperature characteristics in a case where the temperature sensor circuit 50 is made up of the ring oscillator 80.

In the any-time calibration according to the eleventh working example, the temperature-dependent characteristics (delay time/output frequency-temperature characteristics) of the temperature sensor circuit 50 can be calibrated at a plurality of points of the linear characteristics, and accordingly the accuracy of calibrating the temperature-dependent characteristics of the temperature sensor circuit 50 can be improved.

<Modifications>

The technology according to the present disclosure has been described thus far on the basis of the preferred embodiments. However, the technology according to the present disclosure is not limited to the above-described embodiments. The configurations and structures of the display device described above in the embodiments are examples and can be modified as appropriate. For example, in the above embodiments, the technology of the present disclosure has been described by taking the liquid crystal display device (liquid crystal panel) as an example; however, the technology of the present disclosure can be applied to a display device other than the liquid crystal display device, specifically, every display device that detects the temperature of the display panel and performs feedback control on the basis of the result of the detection. As the feedback control, feedback control relating to cooling and feedback control relating to color unevenness correction can be exemplified.

The above-described display device according to the present disclosure can be used as a display unit (display device) of an electronic apparatus in any sort of field configured to display the video signal input to the electronic apparatus or the video signal generated within the electronic apparatus as an image or a video. As the electronic apparatus, a projection type display device, a television set, a notebook personal computer, a digital still camera, a portable terminal device such as a mobile phone, and the like can be exemplified. However, the electronic apparatus is not limited to these examples.

The display device according to the present disclosure also includes a display device in a module form having a sealed configuration. Note that a circuit unit, a flexible print circuit (FPC), or the like may be provided in the display module to input a signal or the like to the pixel array unit from the outside and output a signal or the like to the outside from the pixel array unit. Hereinafter, a projection type display device will be demonstrated as a specific example of an electronic apparatus using the display device of the present disclosure. However, the specific example demonstrated here is merely an example and the electronic apparatus is not limited to this projection type display device.

[Projection Type Display Device]

Figure 30:
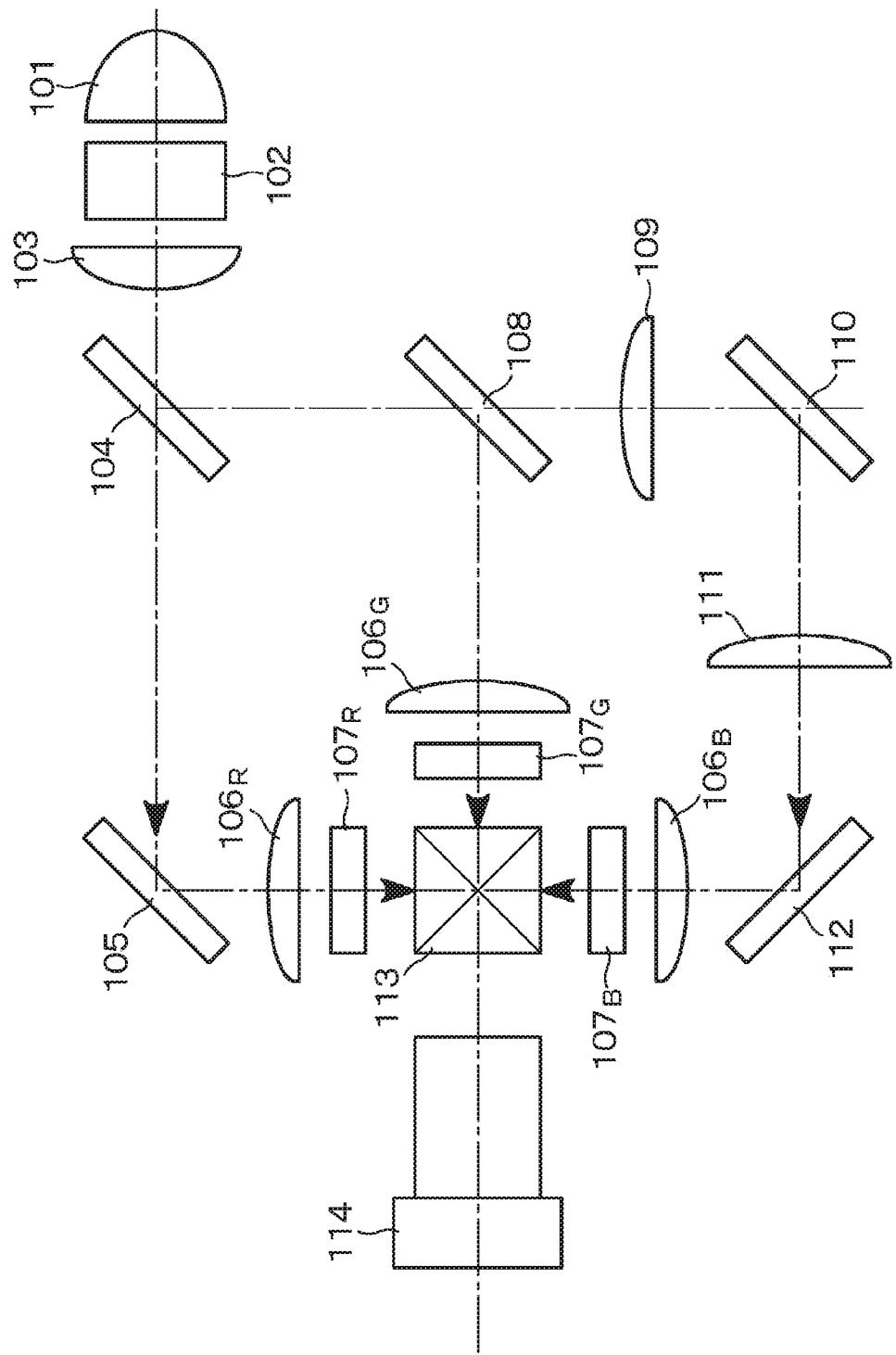
FIG. 30 is a configuration diagram schematically illustrating an optical system of a three-panel projection type display device (projector) as an example of an electronic apparatus according to the present disclosure.

Projection type display devices (so-called projectors) perform color display with additive color mixture, and in general, use a three-panel system in which a liquid crystal panel is used for each of the three primary colors of light, that is, red (R), green (G), and blue (B) to create an image of each primary color using the three liquid crystal panels, and then the images are composited using a prism. A liquid crystal panel used for the projection type display device is generally a panel having a size of around 1.0 inch. FIG. 30 schematically illustrates an optical system of a three-panel projection type display device (projector) as an example of the electronic apparatus according to the present disclosure.

In FIG. 30, after white light released from a light source 101 such as a white lamp is converted from P-polarized light to S-polarized light by a polarization conversion element 102, illumination is made uniform by a fly-eye lens 103, and the white light is incident on a dichroic mirror 104. Then, only a particular color component, for example, a red (R) light component is transmitted through the dichroic mirror 104, and the remaining color light components are reflected by the dichroic mirror 104. After the optical path of the R light component transmitted through the dichroic mirror 104 is modified by a mirror 105, the R light component is incident on an R liquid crystal panel 107R through a lens 106R.

As for the light components reflected by the dichroic mirror 104, for example, a green (G) light component is reflected by a dichroic mirror 108, while a blue (B) light component is transmitted through this dichroic mirror 108. The G light component reflected by the dichroic mirror 108 is incident on a G liquid crystal panel 107G through a lens 106G. After the B light component transmitted through the dichroic mirror 108 passes through a lens 109, the optical path is modified by a mirror 110, and the optical path is further modified by a mirror 112 after passing through a lens 111, such that the B light component is incident on a B liquid crystal panel 107B through a lens 106B.

Note that, although not illustrated in FIG. 30, polarizing plates are disposed on both of incident sides and emission sides of the liquid crystal panels 107R, 107G, and 107B. As is well known, a normally white mode can be set by installing a pair of polarizing plates on the incident side and the emission side such that polarization directions are perpendicular to each other (crossed Nicols), and a normally black mode can be set by installing the pair of polarizing plates such that polarization directions are parallel to each other (parallel Nicols).

The R, G, and B light components that have passed through the liquid crystal panels 107R, 107G, and 107B, respectively, are each incident on a cross prism 113, and are composited by this cross prism 113. Then, light composited by this cross prism 113 is incident on a projection lens 114, and is projected on a screen (not illustrated) by this projection lens 114.

In the three-panel projection type display device having the above configuration, the display device (liquid crystal panel) according to the embodiments described above can be used as the liquid crystal panels 107R, 107G, and 107B as light modulation means (light valves). In the display device according to the embodiments described above, the panel temperature can be grasped more precisely by a high temperature dependence while the high performance of the peripheral circuit unit is maintained. Therefore, in the projection type display device, by using the display device according to the above-described embodiments as the light modulation means of the projection type display device, a more precise measurement result for the panel temperature can be reflected in the feedback control relating to cooling and the feedback control relating to color unevenness correction, which accordingly can contribute to the improvement of the display grade of the projection type display device.

<Configurations that Present Disclosure can Take>

The present disclosure can be also configured as described below.

<<A. Display Device>>

[A-1] A display device including:

a pixel array unit made up of pixels disposed on a substrate;

a peripheral circuit unit that is disposed in a periphery of the pixel array unit and drives the pixels; and a temperature sensor circuit disposed on the same substrate as the pixel array unit, in which the temperature sensor circuit is configured using a circuit having a temperature dependence, and crystallinity of a channel portion of a transistor constituting the temperature sensor circuit is different from crystallinity of a channel portion of a transistor constituting the peripheral circuit unit.

[A-2] The display device according to [A-1] above, in which crystallinity of the channel portion of the transistor constituting the temperature sensor circuit is lower than crystallinity of the channel portion of the transistor constituting the peripheral circuit unit.

[A-3] The display device according to [A-2] above, in which the temperature sensor circuit is disposed in a region apart by a predetermined distance from a region where a circuit portion of the peripheral circuit unit that generates significant heat is disposed.

[A-4] The display device according to [A-3] above, in which the temperature sensor circuit is disposed in a region on an opposite side of a region where a circuit portion of the peripheral circuit unit that generates significant heat is disposed, with the pixel array unit interposed between the temperature sensor circuit and the circuit portion.

[A-5] The display device according to any one of [A-1] to [A-4] above, in which the transistor constituting the temperature sensor circuit has a light-shielding structure that shields at least the channel portion from light.

[A-6] The display device according to [A-5] above, in which the light-shielding structure is formed by metal layers provided so as to cover upper and lower portions of the transistor constituting the temperature sensor circuit.

[A-7] The display device according to [A-6] above, in which the light-shielding structure is formed so as to make a wall on a side surface side by a contact electrode of the transistor constituting the temperature sensor circuit.

[A-8] The display device according to any one of [A-1] to [A-7] above, further including a temperature detection circuit that detects a temperature of a panel made up of the pixel array unit and the peripheral circuit unit disposed on the panel, in accordance with a measurement signal of the temperature sensor circuit, in which an output wire that transfers the measurement signal of the temperature sensor circuit to the temperature detection circuit has an electric shield structure.

[A-9] The display device according to [A-8] above, in which the temperature detection circuit is provided on an external substrate electrically connected to the panel made up of the pixel array unit and the peripheral circuit unit disposed on the panel.

[A-10] The display device according to [A-8] or [A-9] above, in which the electric shield structure includes a shield wire provided adjacent to the output wire of the temperature sensor circuit and set to a fixed potential.

[A-11] The display device according to [A-10] above, in which the temperature detection circuit is a circuit of a single-phase input type, an auxiliary wire is provided adjacent to the output wire of the temperature sensor circuit, and a load corresponding to an input load of the temperature detection circuit is connected to an end portion of the auxiliary wire on a temperature detection circuit side, and the auxiliary wire transfers a signal having a phase reverse to a phase of a signal transferred by the output wire.

[A-12] The display device according to [A-10] above, in which the temperature detection circuit is a circuit of a differential input type, two output wires are wired in parallel between the temperature sensor circuit and the temperature detection circuit, one of the two output wires transfers the measurement signal of the temperature sensor circuit to the temperature detection circuit, and the other of the two output wires transfers a signal having a phase reverse to a phase of the measurement signal of the temperature sensor circuit to the temperature detection circuit.

[A-13] The display device according to any one of [A-1] to [A-12] above, in which calibration is performed at one point of temperature dependence linear characteristics of the temperature sensor circuit on the basis of a reference temperature at time of use.

[A-14] The display device according to any one of [A-1] to [A-12] above, in which calibration is performed at a plurality of points of temperature dependence linear characteristics of the temperature sensor circuit on the basis of a heat generation state of a heat generation source present near the temperature sensor circuit.

[A-15] The display device according to any one of [A-1] to [A-14] above, in which the circuit having a temperature dependence is made up of a delay circuit, a ring oscillator, or a combination of a delay circuit and a ring oscillator.

[A-16] The display device according to [A-15] above, in which the delay circuit has a standby function of turning on and off a circuit operation.

[A-17] The display device according to [A-15] above, in which the ring oscillator has a standby function of turning on and off a circuit operation.

[A-18] The display device according to any one of [A-1] to [A-17] above, further including a cooling unit that cools a display panel formed by the pixel array unit, the peripheral circuit unit, and the temperature sensor circuit, in which the cooling unit controls adjustment of a cooling operation on the basis of a temperature of the display panel detected by the temperature sensor circuit.

[A-19] The display device according to any one of [A-1] to [A-17] above, further including a signal processing unit that performs signal processing on a video signal that drives a pixel, in which the signal processing unit controls uniformity correction on the video signal on the basis of a temperature of the display panel detected by the temperature sensor circuit.

<<B. Electronic Apparatus>>

[B-1] An electronic apparatus including a display device including:

a pixel array unit made up of pixels disposed on a substrate;

a peripheral circuit unit that is disposed in a periphery of the pixel array unit and drives the pixels; and a temperature sensor circuit disposed on the same substrate as the pixel array unit, in which the temperature sensor circuit is configured using a circuit having a temperature dependence, and crystallinity of a channel portion of a transistor constituting the temperature sensor circuit is different from crystallinity of a channel portion of a transistor constituting the peripheral circuit unit.

[B-2] The electronic apparatus according to [B-1] above, in which crystallinity of the channel portion of the transistor constituting the temperature sensor circuit is lower than crystallinity of the channel portion of the transistor constituting the peripheral circuit unit.

[B-3] The electronic apparatus according to [B-2]above, in which the temperature sensor circuit is disposed in a region apart by a predetermined distance from a region where a circuit portion of the peripheral circuit unit that generates significant heat is disposed.

[B-4] The electronic apparatus according to [B-3] above, in which the temperature sensor circuit is disposed in a region on an opposite side of a region where a circuit portion of the peripheral circuit unit that generates significant heat is disposed, with the pixel array unit interposed between the temperature sensor circuit and the circuit portion.

[B-5] The electronic apparatus according to any one of [B-1] to [B-4] above, in which the transistor constituting the temperature sensor circuit has a light-shielding structure that shields at least the channel portion from light.

[B-6] The electronic apparatus according to [B-5] above, in which the light-shielding structure is formed by metal layers provided so as to cover upper and lower portions of the transistor constituting the temperature sensor circuit.

[B-7] The electronic apparatus according to [B-6] above, in which the light-shielding structure is formed so as to make a wall on a side surface side by a contact electrode of the transistor constituting the temperature sensor circuit.

[B-8] The electronic apparatus according to any one of [B-1] to [B-7] above, further including a temperature detection circuit that detects a temperature of a panel made up of the pixel array unit and the peripheral circuit unit disposed on the panel, in accordance with a measurement signal of the temperature sensor circuit, in which an output wire that transfers the measurement signal of the temperature sensor circuit to the temperature detection circuit has an electric shield structure.

[B-9] The electronic apparatus according to [B-8] above, in which the temperature detection circuit is provided on an external substrate electrically connected to the panel made up of the pixel array unit and the peripheral circuit unit disposed on the panel.

[B-10] The electronic apparatus according to [B-8] or [B-9] above, in which the electric shield structure includes a shield wire provided adjacent to the output wire of the temperature sensor circuit and set to a fixed potential.

[B-11] The electronic apparatus according to [B-10] above, in which the temperature detection circuit is a circuit of a single-phase input type, an auxiliary wire is provided adjacent to the output wire of the temperature sensor circuit, and a load corresponding to an input load of the temperature detection circuit is connected to an end portion of the auxiliary wire on a temperature detection circuit side, and the auxiliary wire transfers a signal having a phase reverse to a phase of a signal transferred by the output wire.

[B-12] The electronic apparatus according to [B-10] above, in which the temperature detection circuit is a circuit of a differential input type, two output wires are wired in parallel between the temperature sensor circuit and the temperature detection circuit, one of the two output wires transfers the measurement signal of the temperature sensor circuit to the temperature detection circuit, and the other of the two output wires transfers a signal having a phase reverse to a phase of the measurement signal of the temperature sensor circuit to the temperature detection circuit.

[B-13] The electronic apparatus according to any one of [B-1] to [B-12] above, in which calibration is performed at one point of temperature dependence linear characteristics of the temperature sensor circuit on the basis of a reference temperature at time of use.

[B-14] The electronic apparatus according to any one of [B-1] to [B-12] above, in which calibration is performed at a plurality of points of temperature dependence linear characteristics of the temperature sensor circuit on the basis of a heat generation state of a heat generation source present near the temperature sensor circuit.

[B-15] The electronic apparatus according to any one of [B-1] to [B-14] above, in which the circuit having a temperature dependence is made up of a delay circuit, a ring oscillator, or a combination of a delay circuit and a ring oscillator.

[B-16] The electronic apparatus according to [B-15] above, in which the delay circuit has a standby function of turning on and off a circuit operation.

[B-17] The electronic apparatus according to [B-15] above, in which the ring oscillator has a standby function of turning on and off a circuit operation.

[B-18] The electronic apparatus according to any one of [B-1] to [B-17] above, further including a cooling unit that cools a display panel formed by the pixel array unit, the peripheral circuit unit, and the temperature sensor circuit, in which the cooling unit controls adjustment of a cooling operation on the basis of a temperature of the display panel detected by the temperature sensor circuit.

[B-19] The electronic apparatus according to any one of [B-1] to [B-17] above, further including a signal processing unit that performs signal processing on a video signal that drives a pixel, in which the signal processing unit controls uniformity correction on the video signal on the basis of a temperature of the display panel detected by the temperature sensor circuit.

REFERENCE SIGNS LIST

1 Liquid crystal display device
2 Pixel
10 Liquid crystal panel
11 Pixel array unit
12A, 12B Vertical drive unit
13A, 13B Horizontal drive unit
14 Level shifter
15 Buffer
16 Pad unit
20 Signal processing unit
21 Liquid crystal element
22 Capacitive element
23 Pixel transistor
30 DA conversion unit
31 ($31_1$ to $31_m$) Scanning line
32 ($32_1$ to $32_n$) Signal line
40 Cooling unit
41 First substrate
42 Second substrate
43 Pixel circuit layer
44 Pixel electrode
45, 47 Alignment film
46 Counter electrode
48 Liquid crystal layer
49 Light-shielding film
50 Temperature sensor circuit
60 Panel module

What is claimed is:

1. A display device, comprising:
a pixel array unit made up of pixels disposed on a substrate;
a peripheral circuit unit that is disposed in a periphery of the pixel array unit and drives the pixels; and
a temperature sensor circuit disposed on the same substrate as the pixel array unit, wherein
the temperature sensor circuit is configured using a circuit having a temperature dependence, and
crystallinity of a channel portion of a transistor constituting the temperature sensor circuit is different from crystallinity of a channel portion of a transistor constituting the peripheral circuit unit.

2. The display device according to claim 1, wherein
crystallinity of the channel portion of the transistor constituting the temperature sensor circuit is lower than crystallinity of the channel portion of the transistor constituting the peripheral circuit unit.

3. The display device according to claim 2, wherein
the temperature sensor circuit is disposed in a region apart by a predetermined distance from a region where a circuit portion of the peripheral circuit unit that generates significant heat is disposed.

4. The display device according to claim 3, wherein
the temperature sensor circuit is disposed in a region on an opposite side of a region where a circuit portion of the peripheral circuit unit that generates significant heat is disposed, with the pixel array unit interposed between the temperature sensor circuit and the circuit portion.

5. The display device according to claim 1, wherein
the transistor constituting the temperature sensor circuit has a light-shielding structure that shields at least the channel portion from light.

6. The display device according to claim 5, wherein
the light-shielding structure is formed by metal layers provided so as to cover upper and lower portions of the transistor constituting the temperature sensor circuit.

7. The display device according to claim 6, wherein
the light-shielding structure is formed so as to make a wall on a side surface side by a contact electrode of the transistor constituting the temperature sensor circuit.

8. The display device according to claim 1, further comprising
a temperature detection circuit that detects a temperature of a panel made up of the pixel array unit and the peripheral circuit unit disposed on the panel, in accordance with a measurement signal of the temperature sensor circuit, wherein
an output wire that transfers the measurement signal of the temperature sensor circuit to the temperature detection circuit has an electric shield structure.

9. The display device according to claim 8, wherein
the temperature detection circuit is provided on an external substrate electrically connected to the panel made up of the pixel array unit and the peripheral circuit unit disposed on the panel.

10. The display device according to claim 8, wherein
the electric shield structure includes a shield wire provided adjacent to the output wire of the temperature sensor circuit and set to a fixed potential.

11. The display device according to claim 10, wherein
the temperature detection circuit is a circuit of a single-phase input type,
an auxiliary wire is provided adjacent to the output wire of the temperature sensor circuit, and
a load corresponding to an input load of the temperature detection circuit is connected to an end portion of the auxiliary wire on a temperature detection circuit side, and the auxiliary wire transfers a signal having a phase reverse to a phase of a signal transferred by the output wire.

12. The display device according to claim 10, wherein
the temperature detection circuit is a circuit of a differential input type,
two output wires are wired in parallel between the temperature sensor circuit and the temperature detection circuit,
one of the two output wires transfers the measurement signal of the temperature sensor circuit to the temperature detection circuit, and
the other of the two output wires transfers a signal having a phase reverse to a phase of the measurement signal of the temperature sensor circuit to the temperature detection circuit.

13. The display device according to claim 1, wherein
calibration is performed at one point of temperature dependence linear characteristics of the temperature sensor circuit on a basis of a reference temperature at time of use.

14. The display device according to claim 1, wherein
calibration is performed at a plurality of points of temperature dependence linear characteristics of the temperature sensor circuit on a basis of a heat generation state of a heat generation source present near the temperature sensor circuit.

15. The display device according to claim 1, wherein
the circuit having a temperature dependence is made up of a delay circuit, a ring oscillator, or a combination of a delay circuit and a ring oscillator.

16. The display device according to claim 15, wherein
the delay circuit has a standby function of turning on and off a circuit operation.

17. The display device according to claim 15, wherein
the ring oscillator has a standby function of turning on and off a circuit operation.

18. The display device according to claim 1, further comprising
a cooling unit that cools a display panel formed by the pixel array unit, the peripheral circuit unit, and the temperature sensor circuit, wherein
the cooling unit controls adjustment of a cooling operation on a basis of a temperature of the display panel detected by the temperature sensor circuit.

19. The display device according to claim 18, further comprising
a signal processing unit that performs signal processing on a video signal that drives a pixel, wherein
the signal processing unit controls uniformity correction on the video signal on a basis of a temperature of the display panel detected by the temperature sensor circuit.

20. An electronic apparatus comprising a display device, including:
a pixel array unit made up of pixels disposed on a substrate;
a peripheral circuit unit that is disposed in a periphery of the pixel array unit and drives the pixels; and
a temperature sensor circuit disposed on the same substrate as the pixel array unit, wherein
the temperature sensor circuit is configured using a circuit having a temperature dependence, and
crystallinity of a channel portion of a transistor constituting the temperature sensor circuit is different from crystallinity of a channel portion of a transistor constituting the peripheral circuit unit.

* * * * *